US006974737B2

(12) United States Patent
Snyder et al.

(10) Patent No.: US 6,974,737 B2
(45) Date of Patent: Dec. 13, 2005

(54) SCHOTTKY BARRIER CMOS FABRICATION METHOD

(75) Inventors: John P. Snyder, Edina, MN (US); John M. Larson, Northfield, MN (US)

(73) Assignee: Spinnaker Semiconductor, Inc., Eden Prairie, MN (US)

( * ) Notice: Subject to any disclaimer, the term of this patent is extended or adjusted under 35 U.S.C. 154(b) by 0 days.

(21) Appl. No.: 10/440,498

(22) Filed: May 16, 2003

(65) Prior Publication Data

US 2004/0041226 A1 Mar. 4, 2004

Related U.S. Application Data

(60) Provisional application No. 60/445,711, filed on Feb. 7, 2003, provisional application No. 60/381,162, filed on May 16, 2002, provisional application No. 60/381,236, filed on May 16, 2002, provisional application No. 60/381,237, filed on May 16, 2002, provisional application No. 60/381,238, filed on May 16, 2002, provisional application No. 60/381,239, filed on May 16, 2002, provisional application No. 60/381,240, filed on May 16, 2002, provisional application No. 60/381,320, filed on May 16, 2002, provisional application No. 60/381,321, filed on May 16, 2002, and provisional application No. 60/388,659, filed on May 16, 2002.

(51) Int. Cl.[7] .......................................... H01L 21/8238
(52) U.S. Cl. ...................................... 438/199; 438/581
(58) Field of Search ................................ 438/199, 200, 438/230, 233, 580, 581, 583

(56) References Cited

U.S. PATENT DOCUMENTS

| 4,053,924 A | 10/1977 | Roman et al. |
| 4,300,152 A | 11/1981 | Lepselter |
| 4,485,550 A | 12/1984 | Koeneke et al. |
| 4,513,309 A | 4/1985 | Cricchi |
| 4,554,569 A | 11/1985 | Tove et al. |

(Continued)

FOREIGN PATENT DOCUMENTS

| EP | 0 603 102 A2 | 6/1994 |
| JP | 06097109 | 4/1994 |
| JP | 200124329 | 4/2000 |
| WO | WO 01/45157 A1 | 6/2001 |

OTHER PUBLICATIONS

Magnusson, U. et al. "Bulk Silicon Technology For Complementary MESFETs." *Electronics Letters*, vol. 25, No. 9, Apr. 27, 1989; pps. 565–566.

Tucker, J.R. *Schottky Barrier MOSFETs for Silicon Nanoelectronics*. Jan. 1997, IEEE Frontiers in Electronics, pp. 97–100.

Laplante, Philip A. (Editer–in–Chief). *Comprehensive Dictionary of Electrical Engineering*. 1999, IEEE Press, p. 97.

Muller, Richard S. and Kamins, Theodore I. *Device Electronics for Integrated Circuit*. 1977, 1986, John Wiley & Sons, Second Edition, pp. 484, 505–511.

Sze, S.M. *Physics of Semiconductor Devices*. 1981, John Wiley & Sons, Second Edition, pp. 451–453.

(Continued)

*Primary Examiner*—Hoai Pham
(74) *Attorney, Agent, or Firm*—Dorsey & Whitney LLP

(57) ABSTRACT

A CMOS device and method of fabrication are disclosed. The present invention utilizes Schottky barrier contacts for source and/or drain contact fabrication within the context of a CMOS device and CMOS integrated circuits, to eliminate the requirement for halo/pocket implants, shallow source/drain extensions to control short channel effects, well implant steps, and complex device isolation steps. Additionally, the present invention eliminates the parasitic bipolar gain associated with CMOS device operation, reduces manufacturing costs, tightens control of device performance parameters, and provides for superior device characteristics as compared to the prior art. The present invention, in one embodiment, uses a silicide exclusion mask process to form the dual silicide Schottky barrier source and/or drain contact for the complimentary PMOS and NMOS devices forming the CMOS device.

21 Claims, 15 Drawing Sheets

U.S. PATENT DOCUMENTS

| | | | |
|---|---|---|---|
| RE32,613 | E | 2/1988 | Lepselter et al. |
| 4,780,429 | A | 10/1988 | Roche et al. |
| 4,942,441 | A | 7/1990 | Konishi et al. |
| 5,040,034 | A | 8/1991 | Murakami et al. |
| 5,079,182 | A | 1/1992 | Ilderem et al. |
| 5,250,834 | A | 10/1993 | Nowak |
| 5,323,053 | A | 6/1994 | Luryi et al. |
| 5,338,698 | A | 8/1994 | Subbanna |
| 5,361,225 | A | 11/1994 | Ozawa |
| 5,444,302 | A | 8/1995 | Nakajima et al. |
| 5,663,584 | A | 9/1997 | Welch |
| 5,665,993 | A | 9/1997 | Keller et al. |
| 5,760,449 | A | 6/1998 | Welch |
| 5,767,557 | A | 6/1998 | Kizilyalli |
| 5,801,398 | A | 9/1998 | Hebiguchi |
| 5,883,010 | A | 3/1999 | Merrill et al. |
| 5,891,769 | A | 4/1999 | Liaw et al. |
| 6,037,605 | A | 3/2000 | Yoshimura |
| 6,096,590 | A | 8/2000 | Chan et al. |
| 6,130,750 | A | 10/2000 | Ausschnitt et al. |
| 6,153,484 | A | 11/2000 | Donaton et al. |
| 6,160,282 | A | 12/2000 | Merrill |
| 6,255,227 | B1 | 7/2001 | Donaton et al. |
| 6,268,636 | B1 | 7/2001 | Welch |
| 6,303,479 | B1 | 10/2001 | Snyder |
| 6,323,528 | B1 | 11/2001 | Yamazaki et al. |
| 6,353,251 | B1 | 3/2002 | Kimura |
| 6,413,829 | B1 | 7/2002 | Yu |
| 6,420,742 | B1 | 7/2002 | Ahn et al. |
| 6,452,232 | B1 | 9/2002 | Adan |
| 6,486,080 | B2 | 11/2002 | Chool et al. |
| 6,495,882 | B2 | 12/2002 | Snyder |
| 6,509,609 | B1 | 1/2003 | Zhang et al. |
| 6,548,875 | B2 * | 4/2003 | Nishiyama ................. 257/377 |
| 6,555,879 | B1 | 4/2003 | Krivokapic et al. |
| 6,661,061 | B1 | 12/2003 | Gardner et al. |
| 6,744,103 | B2 | 6/2004 | Snyder |
| 6,784,035 | B2 | 8/2004 | Snyder et al. |
| 2001/0024847 | A1 | 9/2001 | Snyder |
| 2002/0030231 | A1 | 3/2002 | Okawa et al. |
| 2002/0125471 | A1 | 9/2002 | Fitzgerald et al. |
| 2003/0057416 | A1 | 3/2003 | Currie et al. |

OTHER PUBLICATIONS

Pierret, Modular Series on Solid State Devices, vol. 1 Semiconductor Fundamentals, 1983, Addison–Wesley, pp. 29–33.

Huang et al. *Two Dimensional Numerical Simulation of Schottky Barrier MOSFET with Channel Length to 10 nm.* IEEE Transactions on Electron Devices, vol. 45, No. 4, Apr. 1988, pp. 842–848.

Saitoh et al. *Analysis of Short–Channel Schottky Source/Drain MOSFET on Silicon–on–Insulator Substrate Demonstration of Sub–50–nm n–Type Devices with Metal Gate.* Jpn. J. Appl. Phys., part 1, vol. 38, No. 11, Nov. 1999, pp. 6226–6231.

Wolf, Stanley. *Silicon Processing For the VLSI Era, vol. 3: The Submicron MOSFET*, Lattice Press, Sunset Beach, CA, pp. 523–528 (1995).

Lepselter, M.P., Sze, S.M. *SB–IGFET: An Insulated Gate Field Effect Transistor Using Schottky Barrier Contacts for Source and Drain.* Proceedings of the IEEE, Aug. 1968; pp. 1400–1402.

Lepselter, M.P., Macrae, A.U., Macdonald, R.W. *SE–IGFET, II: An Ion Implanted IGFET Using Schottky Barriers.* Proceedings of the IEEE, May 1969; pp. 812–813.

Kisaki, Hitoshi. *Tunnel Transistor.* Proceedings of the IEEE, Jul. 1973; pp. 1053–1054.

Tu, K.N. Thompson, R.D., Tsaur, B.Y. *Low Schottky Barrier of Rare–Earth Silicide on n–Si.* Applied Physics Letters, vol. 38, No. 8, Apr. 1981; pp. 626–628.

Koeneke, C.J., Sze, S.M., Levin, R.M., Kinsbron, E. *Schottky MOSFET for VLSI.* IEDM, 1981; pp. 367–370.

Sugino, M., Akers, L.A., Rebeschini, M.E. *CMOS Latch–Up Elimination Using Schottky Barrier PMOS.* IEDM, 1982; pp. 462–465.

Koeneke, C.J., Lynch, W.T. *Lightly Doped Schottky MOSFET.* IEDM, 1982; pp. 466–469.

Mochizuki, T., Wise, K.D. *An n–Channel MOSFET with Schottky Source and Drain.* IEEE Electron Device Letters, EDL–5, No. 4, Apr. 1984; pp. 108–111.

Oh, C.S., Koh, Y.H., Kim, C.K. *A New P–Channel MOSFET Structure with Schottky Clamped Source and Drain*, IEDM, 1984; pp. 609–612.

Swirhun, Stanley E., et al. *A VLSI Suitable Schottky Barrier CMOS Process.* IEEE Transactions on Electron Devices, ED–32, No. 2, Feb. 1985; pp. 194–202.

Tove, P.A., Bohlin, K., Masszi, F., Norde, H., Nylander, J., Tiren, T., Magnusson, U. *Complementary Si MESFET Concept Using Silicon–on–Sapphire Technology.* IEEE Electron Device Letters, vol. 9, No. 1, Jan. 1988; pp. 47–49.

Tove, P.A., Bohlin, K.E., Norde, H., Magnusson, U., Tiren, J., Soderbarg, A., Rosling, M., Masszi, F., Nyander, J. *Silicon IC Technology Using Complementory MESFETs.* Solid State Devices, Elsevier Science Publishers (North Holland), 1988; pp. 607–609.

Tsui, B., Chen, M. *A Novel Process for High–Performance Schottky Barrier PMOS.* J. Electrochem Soc., vol. 136, No. 5, May 1989; pp. 1456–1459.

Misra, D., Simhadri, V.S. *A Survey of the Potential of an IrSi Schottky Barrier MOSFET Based on Simulation Studies.* Solid State Electronics, vol. 35, No. 6, 1992; pp. 829–833.

Hattori, Reiji, Nakae, Akihiro, Shirafuji, Junji. *A New Type of Tunnel–Effect Transistor Employing Internal Field Emission of Schottky Barrier Junction.* Japan J. Appl. Phys., vol. 31, 1992; pp. L1467–L1469.

Unewisse, M.H., Storey, J.W.V. *Electrical and Infared Investigation of Erbium Silicide.* J. Appl. Phys., vol. 72, No. 6, Sep. 1992; pp. 2367–2371.

Hattori, Reiji, Shirafuji, Junji. *Numerical Simulation of Tunnel Effect Transistors.* Japan J. Appl. Phys., vol. 33, 1994; pp. 612–618.

Tucker, J.R., Wang, C., Lyding, J.W., Shen, T.C., Abeln, G.C. *Nanometer Scale MOSFETs and STM Patterning on Si.* SSDM 1994, Aug. 1994; pp. 322–324.

Tucker, J.R., Wang, C., Carney, P.S. *Silicon Field–Effect Transistor Based on Quantum Tunneling.* Applied Physics Letters, vol. 65, No. 5, Aug. 1, 1994; pp. 618–620.

Kimura, Mitsuteru, Matsudate, Tadashi. *A New Type of Schottky Tunnel Transistor.* IEEE Electron Device Letters, EDL–15, No. 10, Oct. 1994, pp. 412–414.

Snyder, John P., Helms, C.R., Nishi, Yoshio. *Experimental Investigaton of a PtSi Source and Drain Field Emission Transistor.* Applied Physics Letters, vol. 67, No. 10, Sep. 4, 1995; pp. 1420–1422.

Wolf, Stanley. *Silicon Processing for the VLSI Era.* vol. 3: The Submicron MOSFET, Lattice Press, Sunset Beach, CA, 1995; pp. 523–528.

Rishton, S.A., Ismail, K., Chu, J.O., Chan, K. *A MOS Transistor with Schottky Source/Drain Contacts and a Self–Aligned Low–Resistance T–gate*, Microelectronics Engineering, vol. 35, 1997; pp. 361–363.

Nishisaka, Mika, Asano, Tanemasa. *Reduction of the Floating Body Effect in SOI MOSFETs by Using Schottky Source/Drain Contacts*. Japan J. Appl. Phys., vol. 37, Mar. 1998; pp. 1295–1299.

Wang, C., Snyder, John P., Tucker, J.R. *Sub–50nm PtSi Schottky Source/Drain p–MOSFETs*. 56th Annual Device Research Conference Digest, Jun. 1998, pp. 72–73.

Taur, Yuan, Wann, Clement H., Frank, David J, *25 nm CMOS Design Considerations*. IEDM Technical Digest, Dec. 1998; pp. 789–792.

Hargrove, M., Crowder, S., Novak, E., Logan, R., Han, L.K., Ng, H., Ray, A., Sinitsky, D., Smeys, P., Guarin, F., Oberschmidt, J., Crabbe, E., Yee, D., Su, L. *High Performance Sub–0.08um CMOS with Dual Gate Oxide and 9.7 ps Inverter Delay*. IEDM Technical Digest, Dec. 1998; pp. 627–630.

Zhao, Q.T., Klinkhammer, F., Dolle, M., Kappius, L., Mantl, S. *Nanometer Patterning of Epitaxial CoSi2/Si(100) for Ultrashort Channel Schottky Barrier Metal–Oxide–Semiconductor Field Effect Transistors*. Applied Physics Letters, vol. 74, No. 3, Jan. 18, 1999; pp. 454–456.

Wang, C., Snyder, John P., Tucker, J.R. *Sub–40nm PtSi Schottky Source–Drain Metal–Oxide–Semiconductor Field–Effect–Transistors*. Applied Physics Letters, vol. 74, No. 8, Feb. 22, 1999; pp. 1174–1176.

Snyder, John P., Holms, C.R., Nishi, Yoshio. *Analysis of the Potential Distribution in the Channel Region of a Platinum Silicided Source/Drain Metal Oxide Semiconductor Field Effect Transistor*. Applied Physics Letters, vol. 74, No. 22, May 31, 1999; pp. 3407–3409.

Saitoh, W., Yamagami, S., Itoh, A., Asada, M. *35nm Metal Gate SOI–p–MOSFETs with PtSi Schottky Source/Drain*. 57th Annual Device Research Conference Digest, Jun. 1999; pp. 30–31.

Geppert, Linda. *The 100–Million Transistor IC*. IEEE Spectrum, Jul. 1999; pp. 23–24.

Taur, Yuan. *The Incredible Shrinking Transistor*, IEEE Spectrum, Jul. 1999; pp. 25–29.

Neudeck, Gerold W. *Volume II: The PN Junction Diode*, Modular Series On Solid State Devices. Addison–Wesley, 1983; pp. 8–10.

On–line Encyclopedia Britannica, 2001, definition of "rare–earth element.", date not established; 2 pages.

Sze, S.M. *Physics of Semiconductor Devices*, John Wiley & Sons, Second Edition, 1981; pp. 293–294.

Calvet, L. E., Luebben, H., Reed, M.A., Wang, C., Snyder, J.P., and Tucker, J.R. *Subthreshold and scaling of PtSi Schottky barrier MOSFETs*, 2000 Academic Press, Superlattices and Microstructures, vol. 28, No. 5/6; pp. 501–506.

Wolf, Stanley. *Silicon Processing for the VLSI Era, vol. 3: The Submicron MOSFET*. Lattice Press, 1995; pp. 183–187.

Web page "provided by Laurie Calvet", "Device Physics of the SBMOSFET", http://www.eng.yale.edu/reedlab/research/semicond.html, date not established; 7 pages.

Winstead, B. and Ravaioli, U. *Simulation of Schottky Barrier MOSFET's with a Coupled Quantum Injection/Monte Carol Technique*. IEEE Transactions on Electron Device, vol. 47, No. 6, Jun. 2000; pp. 1241–1246.

Gang, D., Xiaoyan, L., Lei, S., Jiaping, Y., Ruqi, H., Houlet, P., and Fujitan, H. *Monte Carol Simulation of 50nm n–Channel Schottky Barrier Tunneling Transistors*. Chinese Journal of Electronics, vol. 11, No. 2, Apr. 2002; pp. 200–203.

Rishton, S.A., Ismail, K., Chu, J.O., Chan, K.K., Lee, K.Y. *New Complimentary metal–oxide semiconductor technology with self–aligned Schottky source/drain and low–resistance T gates*. J. Vac. Sci. Technol. B, 15(6), Nov./Dec. 1997, pp. 2795–2798.

Kedzierski, J., Xuan, P., Subramanian, V., Bokor, J., King, T–J., Hu, C., Anderson, E. *A 20 nm gate–length ultra–thin body p–MOSFET with silicide source/drain. Superlattices and Microstructures*, vol. 28, No. 5/6, 2000, pp. 445–452.

Lancaster, D. *CMOS Cookbook, Second Edition*. Howard W. Sams and Company, 1988, p. 2.

International Technology Roadmap for Semiconductors 1999, US Copyright 1999 by Semiconductor Industry Association, Front End Processes Section, p. 107.

Hitoshi Kisaki *Tunnel Transistor* Proceedings of the IEEE, Jul. 1973, pp. 1053–1054.

Random House College Dictionary, 1980, Random House, Inc., Revised Ed., pp. 17 and 1066.

* cited by examiner

SCHOTTKY BARRIER CMOS FABRICATION METHOD

CROSS-REFERENCE TO RELATED APPLICATION(S)

This application claims priority to U.S. provisional patent application No. 60/445,711, filed Feb. 7, 2003. This application claims priority to U.S. provisional patent application No. 60/381,162, filed May 16, 2002. This application claims priority to U.S. provisional patent application No. 60/381,238, filed May 16, 2002. This application claims priority to U.S. provisional patent application No. 60/388,659, filed May 16, 2002. This application claims priority to U.S. provisional patent application No. 60/381,240 filed May 16, 2002. This application claims priority to U.S. provisional patent application No. 60/381,237, filed May 16, 2002. This application claims priority to U.S. provisional patent application No. 60/381,321, filed May 16, 2002. This application claims priority to U.S. provisional patent application No. 60/381,239, filed May 16, 2002. This application claims priority to U.S. provisional patent application No. 60/381,236, filed May 16, 2002. This application claims priority to U.S. provisional patent application No. 60/381,320, filed May 16, 2002. Each of the above provisional patent applications is incorporated by reference herein in its entirety.

This application is related to U.S. patent application Ser. No. 10/236,685, filed Sep. 6, 2002, which is a continuation of application No. 09/777,536, filed Feb. 6, 2001, now issued as U.S. Pat. No. 6,495,882, which is a divisional of application Ser. No. 09/465,357, filed Dec. 16, 1999, now issued as U.S. Pat. No. 6,303,479. This application is also related to U.S. patent application Ser. No. 10/342,590, filed on Jan. 15, 2003, which claims priority to U.S. provisional patent application No. 60/351,114, filed Jan. 23, 2002 and U.S. patent application Ser. No. 60/319,098, filed Jan. 25, 2002. This application is also related to U.S. patent application Ser. No. 10/215,447, filed Aug. 9, 2002, which is a continuation-in-part of U.S. patent application Ser. No. 09/928,124 and U.S. patent application Ser. No. 09/928,163, both filed Aug. 10, 2001. Each of the above applications is incorporated by reference herein in its entirety.

FIELD OF THE INVENTION

The present invention generally relates to the field of semiconductor systems and manufacturing processes. More particularly, the present invention relates to semiconductor integrated circuits (ICs) having Schottky barrier Metal-Oxide-Semiconductor-Field-Effect-Transistors (MOSFETs) including Schottky barrier P-type MOSFETs (PMOS), N-type MOSFETs (NMOS) and/or Schottky barrier complimentary MOSFETs (CMOS), and the manufacturing processes thereof.

BACKGROUND OF THE INVENTION

Since the invention of the transistor in the late 1940s, tremendous advances have been made in the field of semiconductors and microelectronics. Today, the dominant semiconductor technology is CMOS—Complimentary Metal-Oxide-Semiconductors. Current CMOS technology allows for the cost-effective fabrication of integrated circuits with over 100 million components—all on a piece of silicon roughly 10 mm on a side. The one billion transistor IC will be commercially available within a few years. The desire for greater functionality and performance at less cost per IC drives several trends.

First, functionality drives IC transistor counts up. Second, the transistors themselves are being reduced in size so as to achieve greater packing density and, very importantly, to improve their performance. As far as performance is concerned, the key parameter for MOSFETs is the channel length. The channel length (L) is a distance that charge carriers travel to pass through the device, and a reduction in this length simultaneously implies higher current drives, reduced parasitic resistances and capacitances and improved high-frequency performance. A common figure-of-merit is the power-delay product, and this generalized measure of transistor performance improves as the cube of the inverse of the channel length ($1/L^3$). This explains the tremendous incentive that IC manufacturers have to reduce the channel length as much as manufacturing capabilities will allow.

For digital applications, MOS transistors behave like switches. When 'on', they drive relatively large amounts of current and when turned 'off' they are characterized by a certain amount of leakage current. A common CMOS inverter circuit, comprising an NMOS and PMOS device connected in series, dissipates appreciable power only during switching transients. Otherwise, the quiescent power dissipation, or the power dissipated by the CMOS circuit when idle, is a strong function of MOSFET leakage current, and significantly affects the overall circuit power dissipation for most applications.

As channel lengths are reduced, drive current increases, which is beneficial for circuit performance as stated above. However, leakage current increases as well. Leaky transistors contribute to quiescent power dissipation and in extreme cases can affect the transfer of binary information during active operation. Device designers therefore have good reason to keep MOSFET leakage currents low as channel lengths are reduced.

MOS transistor leakage currents are traditionally controlled by introducing controlled amounts of impurities (dopants) into the region between the source and drain electrodes (channel region) of the device, and by tailoring the source/drain lateral and vertical doping distributions. Although these approaches are effective in shoring up the potential barrier internal to the MOS transistor and therefore reducing the leakage current, they can also contribute to degraded drive current and increased parasitic capacitance—the very items that channel length reduction is meant to improve. Furthermore, depending on exactly how in the manufacturing process the channel and tailored source/drain dopants are introduced, the manufacturing cost can be affected significantly.

Another factor affecting the manufacturing cost is process yield. Yield is the ratio of functioning devices to the total number of devices on a fabricated substrate. Process yield is a strong function of the total number of processing steps. For example, if the average yield per process step is 99.5% and a complete CMOS process has 50 processing steps, then the process yield is approximately 90%. The manufacturing cost of a CMOS process is a strong function of the process yield, increasing as process yield decreases. A simple metric that characterizes the manufacturing complexity and therefore cost of a CMOS technology is the total number of mask steps, each of which contains a series of photoresist procedures, mask alignments, lithography exposures, etching steps, cleaning and metrology. Reducing the number of mask steps in a CMOS process directly reduces manufacturing cost by reducing the total number of process steps and additionally by increasing yield. Given traditional MOS transistor design and architecture, and CMOS manufacturing processes, there are only limited solutions to the trade-off between drive current, leakage current, parasitic capacitance and resistance, and manufacturing complexity and cost.

The present invention offers a new relationship between these competing requirements, and makes possible MOS devices and CMOS-based integrated circuits with characteristics that are not achievable with traditional (impurity doped) MOS architectures. The use of metal for the source and drain provides for improvements to device characteristics in terms of reduced parasitic capacitance, reduced statistical variations in these characteristics (especially as the channel length is decreased) and reduced manufacturing cost and complexity.

Doping Profiles

Previous generations of CMOS devices have relied on MOS transistors having laterally uniform, and vertically non-uniform channel doping profiles to control drain-to-source leakage currents. See Yuan Taur, "The Incredible Shrinking Transistor", IEEE SPECTRUM, pages 25–29 (www.spectrum.ieee.org, ISSN 0018-9235, July 1999). FIG. 1 illustrates an exemplary long-channel conventional MOS device (100) that comprises an impurity doped source (101), an impurity doped drain (102), a conventional MOS type gate stack (103), and a laterally uniform channel doping profile (104) in the substrate to assist in the control of source-to-drain leakage currents. Devices are electrically isolated from each other via a field oxide (105). Such channel dopant profiles are common in devices with channel lengths down to approximately 200 nanometers (nm).

However, as device channel lengths have been reduced into the 100 nm regime the literature teaches that channel doping profiles that are non-uniform in both the lateral and vertical directions are required. Referencing FIG. 2, the exemplary short-channel MOS device (200) has some elements similar to the long-channel MOS device (100). The structure comprises a conventional impurity doped source (201) and drain (202) as well as a conventional MOS gate stack (203) (width<~100 nm, corresponding to the channel length L). The structure further comprises shallow, impurity doped extensions for the source (208) and drain (209) electrodes which are used in conjunction with drain (206) and source (207) pocket doping as well as conventional channel doping (204) to control source to drain leakage currents. Source and drain electrodes (201) and (202) and their respective extensions (208) and (209) (the combination of all four of which comprise the tailored source/drain doping profile) are all of the same doping polarity (either N-type or P-type) and are of the opposite polarity from the channel (204) and pocket doping elements (206) and (207). Again, a field oxide (205) electrically isolates devices from each other.

Conventional CMOS Circuit

Referencing FIG. 3, a typical CMOS inverter circuit 300 is a P-type MOSFET device 301 and an N-type MOSFET device 302 connected in series fabricated on a lightly doped P-type epitaxial semiconductor layer 331 on a heavily doped semiconductor substrate 330. The source 304,306 and drain 303,305 contacts comprise impurity doped source 304, 306 and drain 303, 305 electrodes, shallow impurity doped source 316, 318 and drain 315, 317 extensions, pocket doping 345, 346 and channel and substrate doping 347, 348. The drain contacts 303,305 of the two devices 301, 302 are connected, the source 304 of the P-type device 301 is connected to a supply voltage $V_{dd}$ 307, the source 306 of the N-type device 302 is connected to a lower voltage $V_{ss}$ 308, usually ground, and the gates 309, 310 of the two devices 301, 302 have a common connection $V_g$ 311. The PMOS 301 and NMOS 302 devices are isolated by a field oxide 320 and an N-type well implant 321 for the PMOS device, and the N-type well implant 321 is electrically connected via a heavily doped N-type ohmic contact 340 to $V_{dd}$ 307.

The output voltage $V_o$ 312 at the common drain connection depends on the input voltage at the gate $V_g$ 311. When $V_g$ 311 is high (usually $V_{dd}$ 307), then the N-type device 302 is "on" and the P-type device 301 is "off". That is, a channel region 313 of the N-type device 302 conducts while a channel region 314 of the P-type device 301 does not conduct. The result being that the output voltage $V_o$ 312 changes to that of the N-type source 306, or $V_{ss}$ 308. The opposite occurs when $V_g$ 311 is low (usually $V_{ss}$ 308). The N-type device 302 is now "off" and the P-type device 301 "on", and the output voltage $V_o$ 312 changes to that of the P-type source 304, or $V_{dd}$ 307. In summary, a high (low) input voltage $V_g$ 311 produces a low (high) output voltage $V_o$ 312, effectively providing an inverting function. One exemplary characteristic of this typical CMOS inverting circuit is that appreciable current only flows during switching of the input voltage $V_g$ 311 from high to low or low to high. Otherwise, when idle, the dominant source of quiescent power dissipation is leakage current.

Schottky Barrier CMOS

In U.S. Pat. No. 5,760,449, Welch discloses a Schottky barrier transistor device system having N-channel and P-channel MOSFETS connected in series, in which source junctions, not drain junctions, of the N- and P-type devices are electrically interconnected, and which uses a mid-gap chromium silicide to form the Schottky barrier source and drain regions of both N- and P-type devices. A mid-gap silicide such as chromium silicide is characterized by a Fermi level that attaches close to the mid band gap for silicon at approximately 0.56 eV. Welch refers to the resulting circuit as a "single device equivalent to CMOS" because the CMOS device is fabricated on a single doping type semiconductor substrate and uses identical metal silicide to form the source and drain regions of both transistors. Both transistors of the device are identical, as compared to conventional CMOS devices in which complimentary opposite-type N- and P-type transistors are used together. Further, Welch teaches that the device demonstrates regenerative inverting switching characteristics. As the device switches, the source voltage changes (not the drain as in a conventional CMOS inverter), thereby increasing the potential difference from gate to source, thereby "regeneratively" or additionally turning the device "on," until the switching is complete. Welch notes that the mid-gap chromium silicide results in symmetric operating characteristics for the two MOSFET devices, enabling a CMOS-like inverting technology depending on the bias conditions. However, mid-gap suicides also result in unacceptably low drive current and high drain-to-source leakage currents. Further, Welch does not describe the performance of the inverter circuit using short channel MOSFET devices, nor does Welch address the issue of channel or substrate doping to improve the off-state leakage currents of the individual MOSFET devices.

In summary, the prior art does not disclose or teach a Schottky barrier, metal source/drain CMOS device or a fabrication process for the Schottky barrier, metal source/drain CMOS device.

Device Isolation

To fabricate integrated circuits, individual transistor devices must be isolated from one another in order to allow each device to operate independently of other devices in the circuit. Optimal device isolation technologies have high density, reasonable process complexity, high yield, and acceptable parasitic effects. Device isolation divides the semiconductor substrate into regions of two types. A first region has an exposed semiconductor surface and is denoted as an active region—a region in which the transistors are fabricated. A second region comprises a "field oxide" that masks the semiconductor substrate and is denoted as a field region—a region in which no devices are fabricated.

There are many device isolation technologies such as local oxidation of silicon (LOCOS) and shallow trench isolation (STI). Although LOCOS and STI have been optimized for advanced CMOS technologies, they suffer from several integration challenges. Examples of a few LOCOS challenges include stress of the silicon substrate induced during the oxidation process, the white ribbon nitride effect, and the existence of the so-called bird's beak phenomena. Although solutions exist for most of these challenges, they add complexity to the manufacturing process or limit the process flexibility.

Silicide Exclusion Mask Process

Silicides conventionally are provided for across an entire semiconductor substrate. Introduction of silicides may detrimentally affect circuit performance for some applications such as active CMOS pixel arrays (increased photodiode dark current and opaqueness) or analog circuits (degrade signal integrity, aggravate circuit stress, affect threshold voltage offset and junction leakage). A silicide exclusion mask process has been developed in the prior art to selectively mask portions of the semiconductor substrate to prevent silicides from forming in the masked regions. See for example U.S. Pat. No. 6,160,282, in which Merrill discloses a silicide exclusion mask process to improve performance of an active CMOS pixel array and U.S. Pat. No. 5,883,010 in which Merrill discloses a spacer oxide mask process to provide silicide exclusion.

A silicide exclusion mask process typically comprises deposition of a silicide exclusion oxide mask layer, deposition of photoresist, patterning of the photoresist, etching the silicide exclusion oxide mask layer so that regions covered by photoresist and oxide are protected from silicide formation and that regions to be silicided are exposed, stripping the photoresist layer, selectively forming silicide metal layers on silicon surfaces exposed by the silicide exclusion oxide mask pattern, and removing the silicide exclusion oxide mask layer. The silicide exclusion mask technique has not been used to fabricate Schottky barrier CMOS devices and circuits.

Accordingly there is a need in the art for a Schottky barrier CMOS device and fabrication process. There is a further need for a short channel CMOS device with improved performance characteristics that has a simplified, low cost fabrication process.

SUMMARY OF THE INVENTION

In summary, in various embodiments, a CMOS device is disclosed comprising a Schottky barrier NMOS device optionally having P-type channel dopants and a Schottky barrier PMOS device optionally having N-type channel dopants. The channel dopants and/or well implants may or may not be electrically contacted by ohmic contacts. The devices may be separated by a field oxide, optionally an oxide window not substantially recessed into the semiconductor substrate.

Another aspect of the present invention is a fabrication process for the CMOS device. A simple non-recessed oxide window is provided as the field oxide. Channel and/or well implants are further introduced to isolate N-type and P-type active regions. A gate electrode for an NMOS device is formed in the N-type active region and a gate electrode for a PMOS device is formed in the P-type active region, the gate electrodes having a thin electrically insulating sidewall spacer. A silicide exclusion mask is used to prevent formation of silicide in the P-type active region while exposing the N-type active region. When the exclusion mask layer is patterned using a wet chemical etch, the exclusion mask layer etch rate is greater than the NMOS device sidewall spacer etch rate. A Schottky or Schottky-like contact is formed by reacting a thin metal layer with the exposed semiconductor substrate at least in areas adjacent to the NMOS gate electrode. Similarly, a silicide exclusion mask is used to prevent formation of silicide in the N-type active region while exposing the P-type active region. When the exclusion mask layer is patterned using a wet chemical etch, the exclusion mask layer etch rate is greater than the PMOS device sidewall spacer etch rate. A Schottky or Schottky-like contact is formed by reacting a thin metal layer with the exposed semiconductor substrate at least in areas adjacent to the PMOS gate electrode.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION

Figure 5:
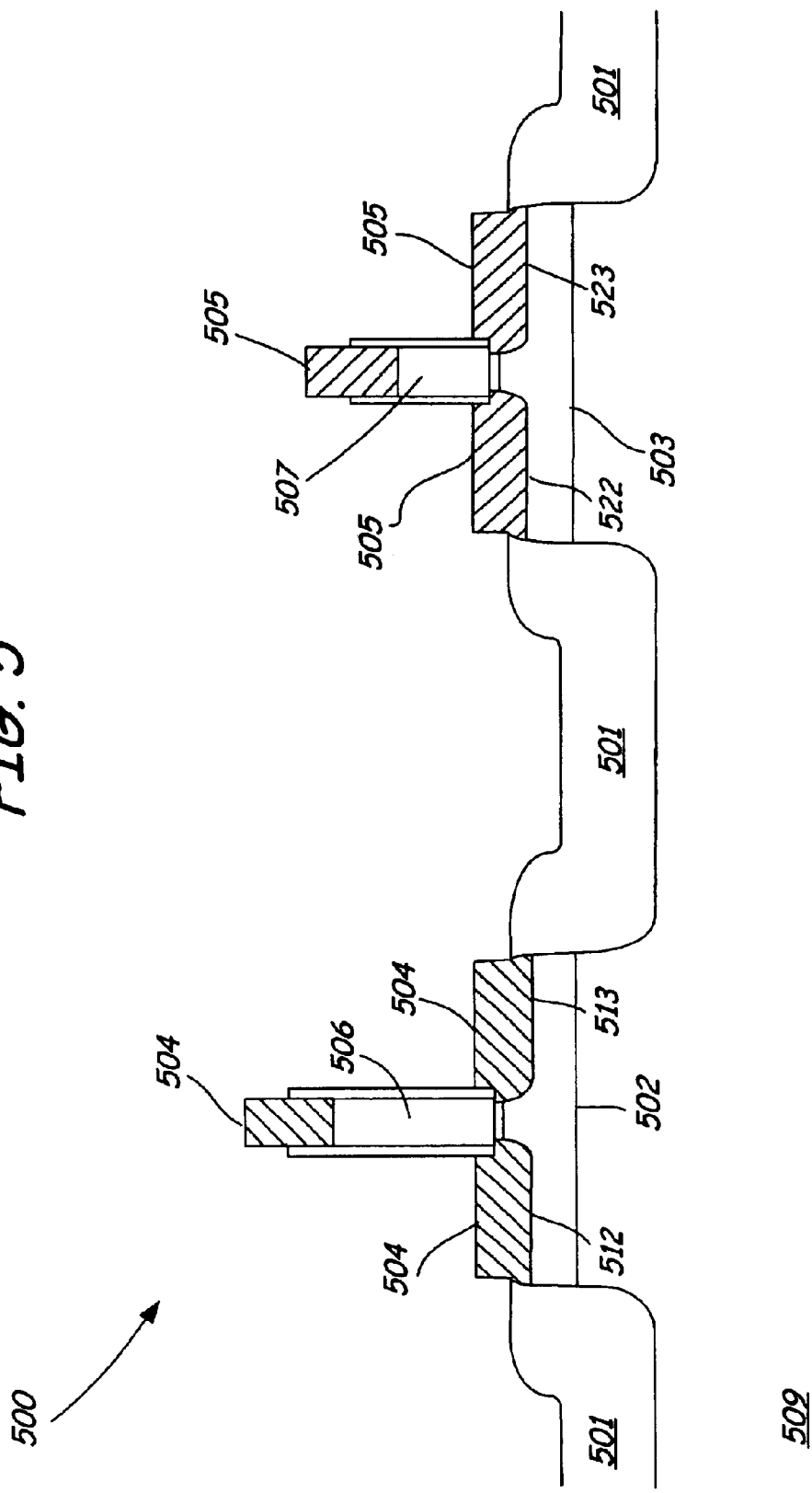
FIG. 5 illustrates a CMOS device according to one embodiment of the present invention .

FIG. 5 shows an exemplary embodiment of the present invention, as exemplified by two final complementary MOSFET structures 500. This embodiment comprises a Schottky barrier N-channel device fabricated with Erbium Silicide 504 for the source/drain regions, and a Schottky barrier P-channel device fabricated with Platinum Silicide 505. Indium 502 and Arsenic 503 layers may be used as the channel dopants for the N-channel and P-channel devices respectively. The gate electrodes are fabricated from in-situ Phosphorous and Boron doped polysilicon films for the N-type 506 and P-type 507 devices respectively. Devices are separated from each other by a field oxide 501 that works in conjunction with the channel and substrate dopants to electrically isolate the devices from each other. The Schottky (or Schottky-like) barriers 512, 513, 522, 523) that exist along the interface of the corresponding metal source/drain 504, 505 and the silicon substrate 509 act as an inherent pocket or halo implant and does so without added parasitic capacitance.

Throughout the discussion in this document the following definitions will be utilized:

Ohmic Contact

An ohmic contact is a low resistivity electrical contact to a semiconductor substrate. For example, impurity-doped ohmic contacts comprise an N-type heavily doped region in contact with an N-type doped semiconductor substrate or a P-type heavily doped region in contact with a P-type doped semiconductor substrate. Additionally, for example, metal ohmic contacts to semiconductor substrate comprise Erbium silicide in contact with an N-type doped semiconductor substrate or Platinum silicide in contact with a P-type doped semiconductor substrate. The contacts that these metal suicides make with their respective semiconductor substrate types are ohmic because of their low Schottky barrier heights to charge carriers and thus low contact resistance.

Well Implants

Figure 1:
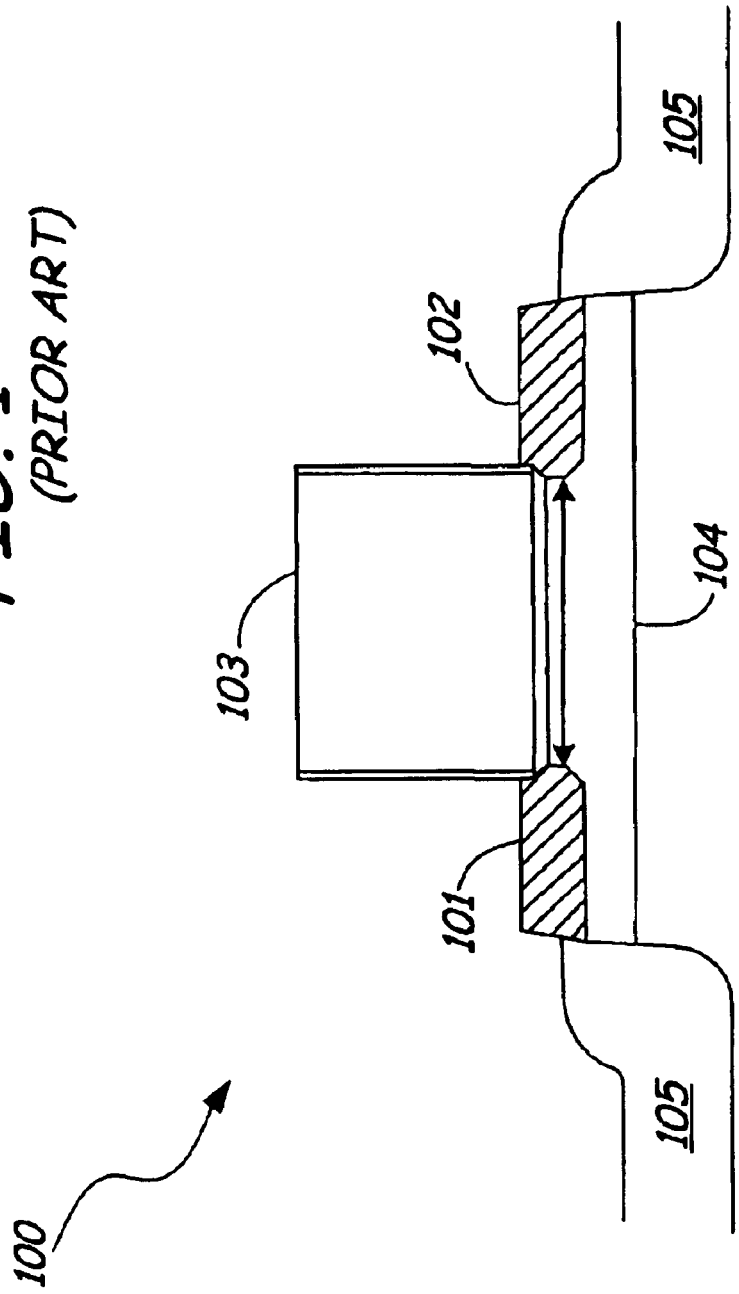
FIG. 1 illustrates a prior art long channel, impurity doped source/drain device.
Figure 2:
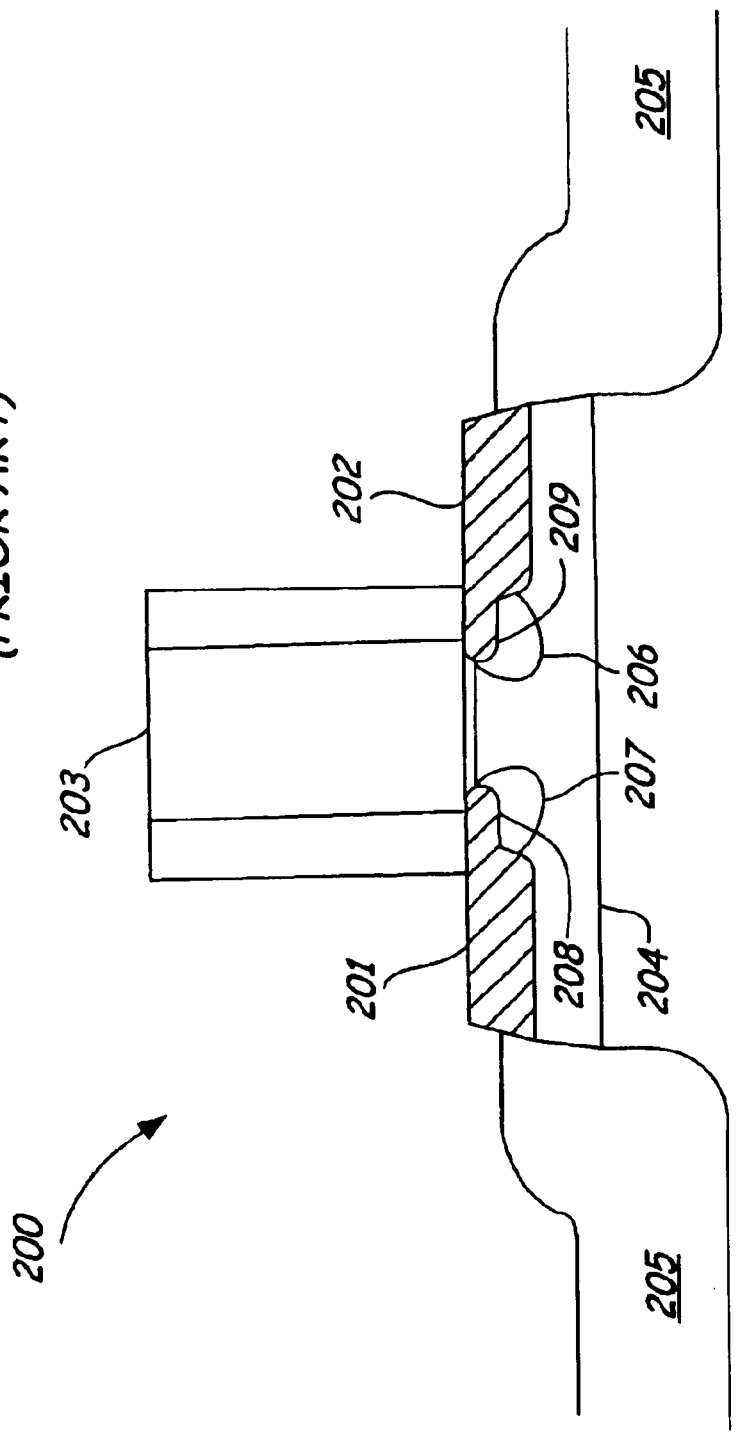
FIG. 2 illustrates a prior art short channel, impurity doped source/drain device with pocket implants and source/drain extensions.
Figure 3:
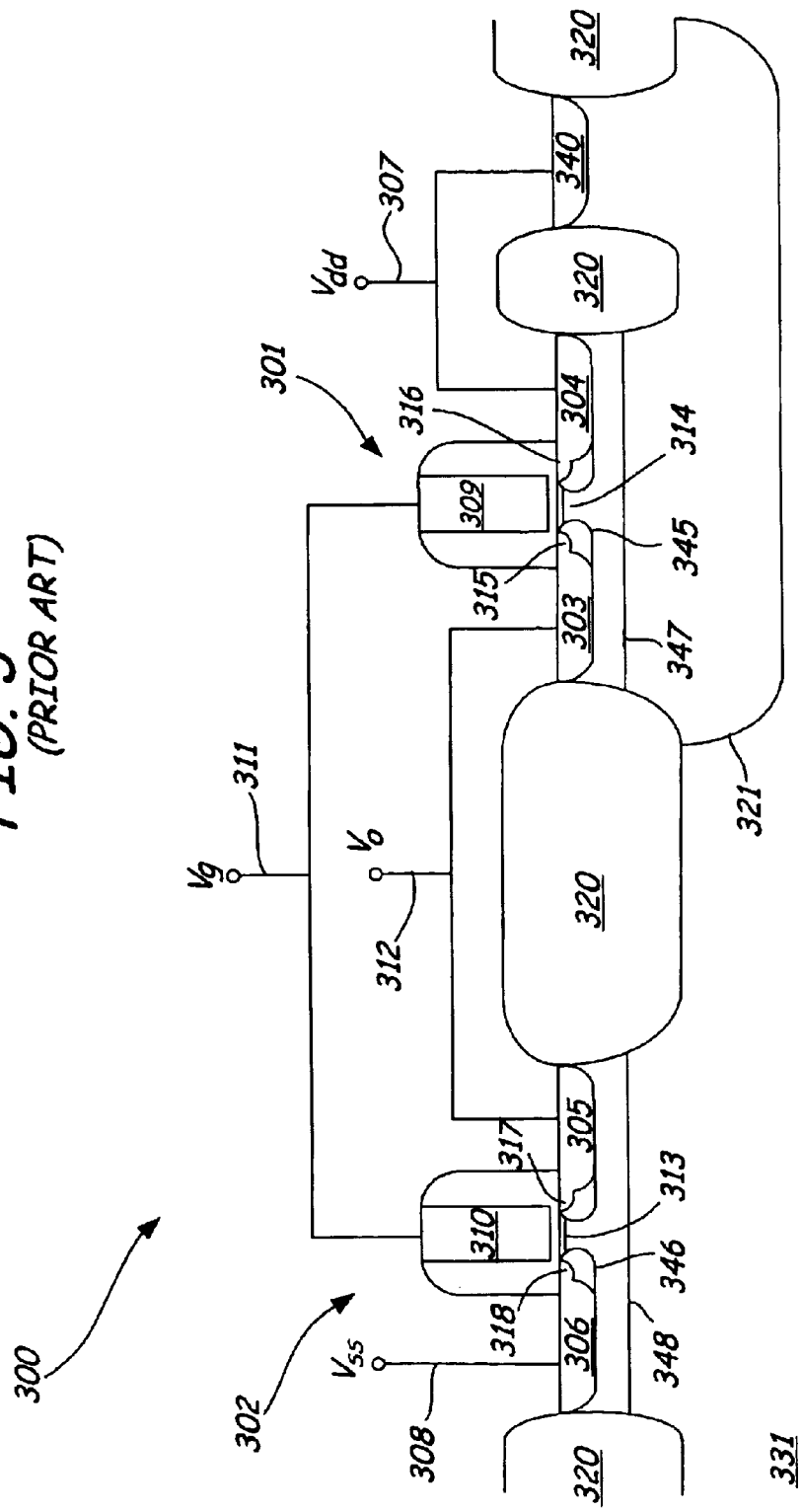
FIG. 3 illustrates a prior art short channel, impurity doped source/drain CMOS inverter circuit.

Latch-up is unique problem for CMOS circuits and is caused by the presence of lateral bipolar NPN and PNP transistors. These unwanted parasitic bipolar transistors can act as amplifiers, causing the circuit to fail by shorting power to ground. To solve this problem, a conventional CMOS layout typically includes N- and P-type well implants for the P- and N-type MOSFET devices respectively. The N- and P-type well implants are electrically contacted via ohmic contacts to $V_{dd}$ and ground power supplies respectively. Referencing FIG. 3 as an example, an N-well 321 is doped with the opposite polarity of that of the semiconductor substrate 330, typically with a doping concentration approximately one order of magnitude greater than the epitaxial substrate layer 331. The N-well 321 has the same doping polarity as that of the channel and substrate doping 347. The well fabrication procedure depends on the requirements for latch-up immunity, and other factors such as packing density and independent threshold voltage adjustment. A heavily doped N-type ohmic contact 340 is provided in direct contact with the N-well 321, and is electrically connected to the supply voltage $V_{dd}$, while the substrate 330 is connected to $V_{ss}$, typically ground.

Channel Length

Figure 4:
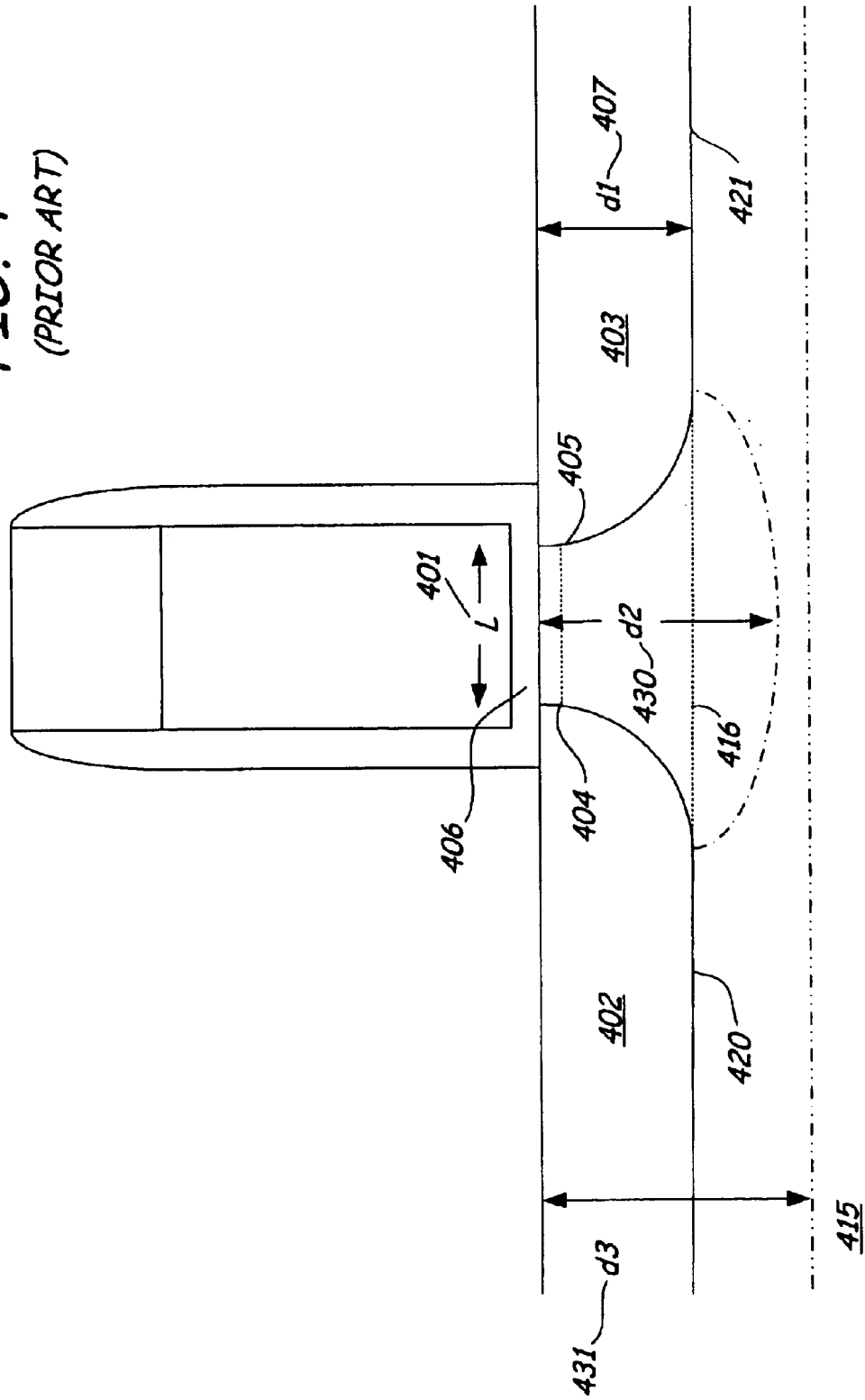
FIG. 4 illustrates the definitions of channel length and channel region.

Referencing FIG. 4, the channel length (L) 401 is a distance that charge carriers travel in the semiconductor substrate 415 to pass from the source electrode 402 to the drain electrode 403. For a metal source/drain MOSFET device, this length is defined by the distance from the interface 404 of the source electrode 402 facing the drain electrode 403, to the interface 405 of the drain electrode 403 facing the source electrode 402, just below the gate insulator 406.

Channel Region, Channel Dopant and Substrate Dopant

Referencing FIG. 4, the current-carrying region of the active region is often referred to as the channel region in a semiconductor device. For a conventional impurity doped source and drain MOSFET device, the channel region in the semiconductor substrate 415 is located very near the gate insulator 406, and does not extend substantially vertically down into the semiconductor substrate 415. However, for other MOSFET device architectures, such as the Schottky barrier source and drain MOSFET, significant current may flow in regions substantially below the gate insulator 406. For the purposes of the present invention, the channel region in the semiconductor substrate 415 extends vertically below the source 402 and drain 403 electrodes to a boundary 416 approximately aligned with the bottom edge 420 of the source 402 and bottom edge 421 of the drain 403 electrodes at a depth $d_1$, 407.

Channel dopant is an impurity dopant provided for in the semiconductor substrate 415 in the channel region, usually for the purpose of improving leakage performance from the source 402 and drain 403 electrodes of the MOSFET device. Substrate dopant is an impurity dopant provided for in the semiconductor substrate below the bottom 416 of the channel region and below the bottom interface 420,421 of the source 402 and drain 403 electrodes.

It is important to understand the difference of a channel dopant and substrate dopant. Referencing FIG. 4, two dopant implants are shown. A first dopant implant is provided for to a depth $d_2$ 430 in exposed regions of a first masking layer and has laterally uniform and vertically non-uniform concentration profiles. A second dopant implant is provided for to a depth $d_3$ 431 in exposed regions of a second masking layer and has laterally uniform and vertically non-uniform concentration profiles. In this example, the first dopant implant and second dopant implant have different concentrations and vertical non-uniform profiles. The resulting MOS device depicted by FIG. 4 has a doping concentration profile in the channel region that is laterally uniform and vertically non-uniform while the substrate doping profile below the channel region has a laterally and vertically non-uniform doping concentration profile.

Semiconductor on Insulator (SOI) Substrate

An SOI substrate comprises a semiconductor material such as silicon having a thickness of approximately 20 nanometers (nm) to 100 nm, on a buried insulating material such as silicon dioxide ($SiO_2$) having a thickness of approximately 100 nm to 400 nm, which is formed on a semiconductor substrate.

MOSFET Not Limitive

The present invention is particularly suitable for use with MOSFET semiconductor devices, but the use of the present teachings is not limited to this particular application. Other semiconductor devices, may be applied to the present invention teachings. Thus, while this specification speaks in terms of 'MOSFET' devices, this term should be interpreted broadly to include any device for regulating the flow of electrical current having a conducting channel that has two or more points of electrical contact.

CMOS Not Limitive

The present invention is particularly suitable for use and fabrication of CMOS integrated circuits, but the use of the present teachings is not limited to this particular application. Other circuits comprising complimentary or non-complimentary NMOS and/or PMOS transistors may be applied to the present invention teachings. Thus, while this specification speaks in terms of 'CMOS' circuits, this term should be interpreted broadly to include any circuit that comprises connected N- and/or P-MOS transistors.

Channel Length Not Limitive

The present invention is particularly suitable for use in situations where short channel length MOSFETs are to be fabricated, especially in the range of channel lengths<100 nm. However, nothing in the teachings of the present invention limits application of the teachings of the present invention to these short channel length devices. Advantageous use of the teachings of the present invention may be had with channel lengths of any dimension.

Dopants Not Limitive

Throughout the discussion herein there will be examples provided that utilize various dopant technologies in regards to MOSFET device fabrication. These dopants are only illustrative of a specific embodiment of the present invention and should not be interpreted to be limitive of the scope of teachings within the current invention.

Note, however, that the present invention specifically anticipates the use of impurity atoms are selected from the group consisting of Arsenic, Phosphorous, Antimony, Boron, Indium, and/or Gallium as being within the scope of the teachings of the present invention.

Circuit Type Not Limitive

One skilled in the art will readily realize that the present invention is not limited in scope to a particular CMOS application or circuit type such as digital logic circuits including inverters, NAND gates, NOR gates, compound gates, multiplexers, and volatile and non-volatile memory. Furthermore, the present invention is not limited to digital or analog CMOS applications. These and all other circuit types that use combinations of NMOS and/or PMOS transistors are within the scope of the teaching of the present invention.

Source/Drain Not Limitive

Throughout the discussion herein there will be examples provided that make reference to 'source' and 'drain' connections in regards to MOSFET device fabrication. One skilled in the art will recognize that in any given MOSFET configuration the nomenclature surrounding these contacts may be swapped without loss of generality, so that the 'source' may be interchanged with the 'drain' contact with no loss in the scope of the present invention. Additionally, one skilled in the art will recognize that while many preferred embodiments of the present invention may be used to fabricate both source and drain connections, there is no requirement that this be the case in actual practice. One, both, or none of the source/drain connections on a given device in the context of an IC or the like may use the teachings of the present invention to advantage.

Thus, the terms 'source' and 'drain' should be interpreted to include the variants 'drain' and 'source' as well as 'source or drain' and 'source and drain'.

Metals Not Limitive

Throughout the discussion herein there will be examples provided that make reference to metals in regards to MOSFET device fabrication. The present invention does not recognize any limitations in regards to what types of metals may be used in affecting the teachings of the present invention. Thus, metals commonly used at the transistor level, such as titanium, cobalt and the like, are specifically anticipated, as well as a plethora of more exotic metals and other alloys. Nothing in the disclosure limits the use of the invention with any particular metal or alloy. One skilled in the art will recognize that any conductive interconnecting material may be used with no loss of generality in implementing the teachings of the present invention.

Note, however, that the present invention specifically anticipates the use of source/drain electrodes formed from the group comprising any of Platinum Silicide, Palladium Silicide, Iridium Silicide, and/or the rare-earth silicides as being within the scope of the teachings of the present invention. It is also noted that in another embodiment, the silicided source/drain can be made of multiple layers of metal silicide, in which case other exemplary silicides, such as titanium silicide or tungsten silicide for example, may be used.

Schottky Not Limitive

Throughout the discussion herein there will be examples provided that make reference to 'Schottky' barriers and like contacts in regards to IC fabrication. The present invention does not recognize any limitations in regards to what types of Schottky interfaces may be used in affecting the teachings of the present invention. Thus, the present invention specifically anticipates these types of junctions to be created with any form of conductive material.

Additionally, while traditional Schottky junctions are abrupt, the present invention specifically anticipates that in some circumstances an interfacial layer may be utilized between the silicon substrate and the actual Schottky barrier metal. Thus, the present invention specifically anticipates 'Schottky-like' junctions and their equivalents to be useful in implementing the present invention. Furthermore, the interfacial layer may comprise materials that have conductive, semi-conductive, and/or insulator-like properties.

Etching Technology Not Limitive

Throughout the discussion herein there will be examples provided that make reference to a variety of etching technologies utilized to remove oxide, silicon and/or metal in the IC fabrication process. The present invention does not restrict the type of etching technology used to achieve the results illustrated in the typical process flows. These etching technologies are well known in the art.

Isolation Technology Not Limitive

Throughout the discussion herein, there will be examples provided that make reference to a variety of isolation technologies utilized to electrically isolate individual NMOS and PMOS transistors. The present invention does not restrict the type of isolation technology used to achieve the results illustrated in the typical process flows. Isolation technologies such as LOCOS, STI and non-recessed oxide windows are well known in the art.

Well Implants Not Limitive

Throughout the discussion herein there will be examples provided that make reference to well implants in regards to IC fabrication. Typically, conventional well implants are electrically contacted via ohmic contacts to power supplies such as $V_{dd}$ and ground for PMOS and NMOS transistors, respectively. The present invention does not restrict the type of electrical contact to the well implants, thereby allowing well implants that may be or may not be electrically contacted to a power supply, such as $V_{dd}$ or ground via ohmic contacts. Any well implant described in the discussion will be characterized as either "electrically contacted to an ohmic contact" or "not electrically contacted to an ohmic contact." The phrase "electrically contacted to an ohmic contact" implies ohmic contacting to a power supply such as $V_{dd}$ or ground for example.

Dopant Profile Not Limitive

Throughout the discussion herein, there will be examples provided that make reference to doping profiles in the channel region and in the semiconductor substrate below the channel region. The present invention does not restrict the type of channel doping and substrate doping profiles that may be used in affecting the teaching of the present invention. One skilled in the art will readily realize that many doping profiles may be used, including for example laterally and vertically non-uniform channel/substrate implants; laterally uniform and vertically non-uniform channel/substrate implants; laterally and vertically uniform channel/substrate implants. These and any combination of these doping profiles and any other channel/substrate doping profile are within the scope of the teachings of the present invention.

Exclusion Mask Process Not Limitive

Throughout the discussion herein, there will be examples provided that make reference to a silicide exclusion mask process for selectively forming silicides in regions of a semiconductor substrate. The present invention does not restrict the exclusion mask process from being used for metal-semiconductor compounds other than metal silicides. One skilled in the art will readily realize that many metal-semiconductor compounds forming Schottky or Schottky-like contacts may be used and are within the scope of the teachings of the present invention.

Substrate Not Limitive

Throughout the discussion herein, there will be examples provided that make reference to a semiconductor substrate on which a Schottky barrier CMOS device is formed. The present invention does not restrict the semiconductor substrate to any particular type. One skilled in the art will readily realize that many semiconductor substrates may be used for Schottky barrier CMOS including silicon, strained silicon and silicon on insulator. These substrate materials may be used and are within the scope of the teachings of the present invention.

Process/Method

Figure 6:
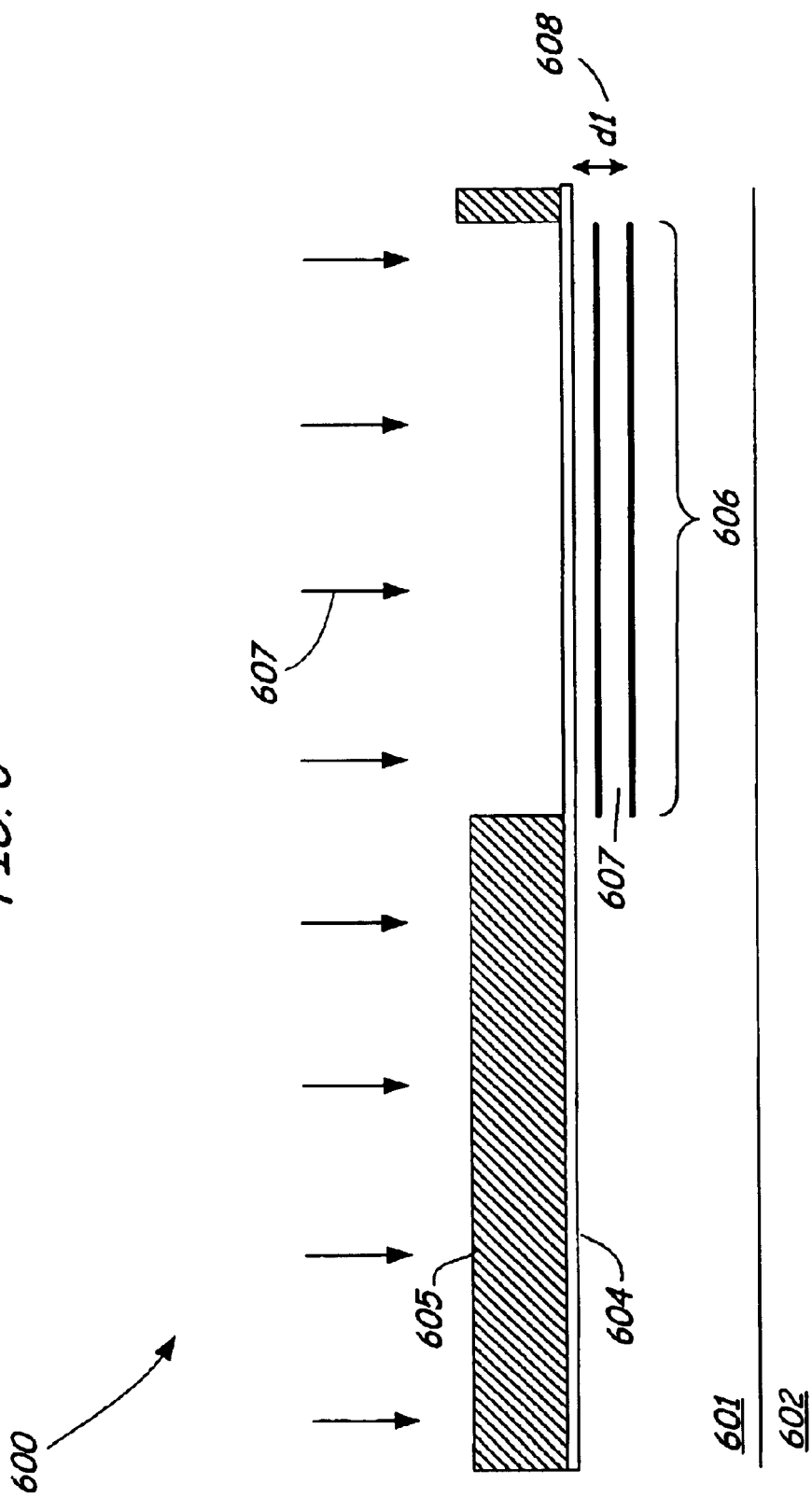
FIG. 6 illustrates an exemplary embodiment of the present invention process using implantation of the P-type device active region.

One exemplary process for the fabrication of a metal source/drain CMOS device is illustrated in FIGS. 6–13. While this process is exemplary of the broad teachings of the present invention, it will be instructive to one skilled in the art to teach the fundamental concepts of the present invention. This exemplary process flow may be described as follows:

Referencing FIG. 6, starting with a heavily doped silicon substrate 602 and a lightly doped epitaxial layer 601 that has means for electrically isolating transistors from one another, a thin screen oxide 604 is grown (approximately 200 Å) to act as an implant mask. In another embodiment, the silicon substrate 601 is strained. The use of a strained silicon substrate 601 in combination with a Schottky barrier MOSFET device results in additional improvements in power and speed performance, as explained in co-pending U.S. patent application Ser. No. 10/342,590, filed on Jan. 15, 2003. In another embodiment, the substrate is SOI. Following the growth of the screen oxide 604 and the formation of a resist pattern layer 605, such that the active region 606 of the PMOS device is exposed, the dopant Arsenic 607 is ion-implanted through the screen oxide to a predetermined depth d1 608 in the silicon (approximately 1000 Å or so).

Figure 7:
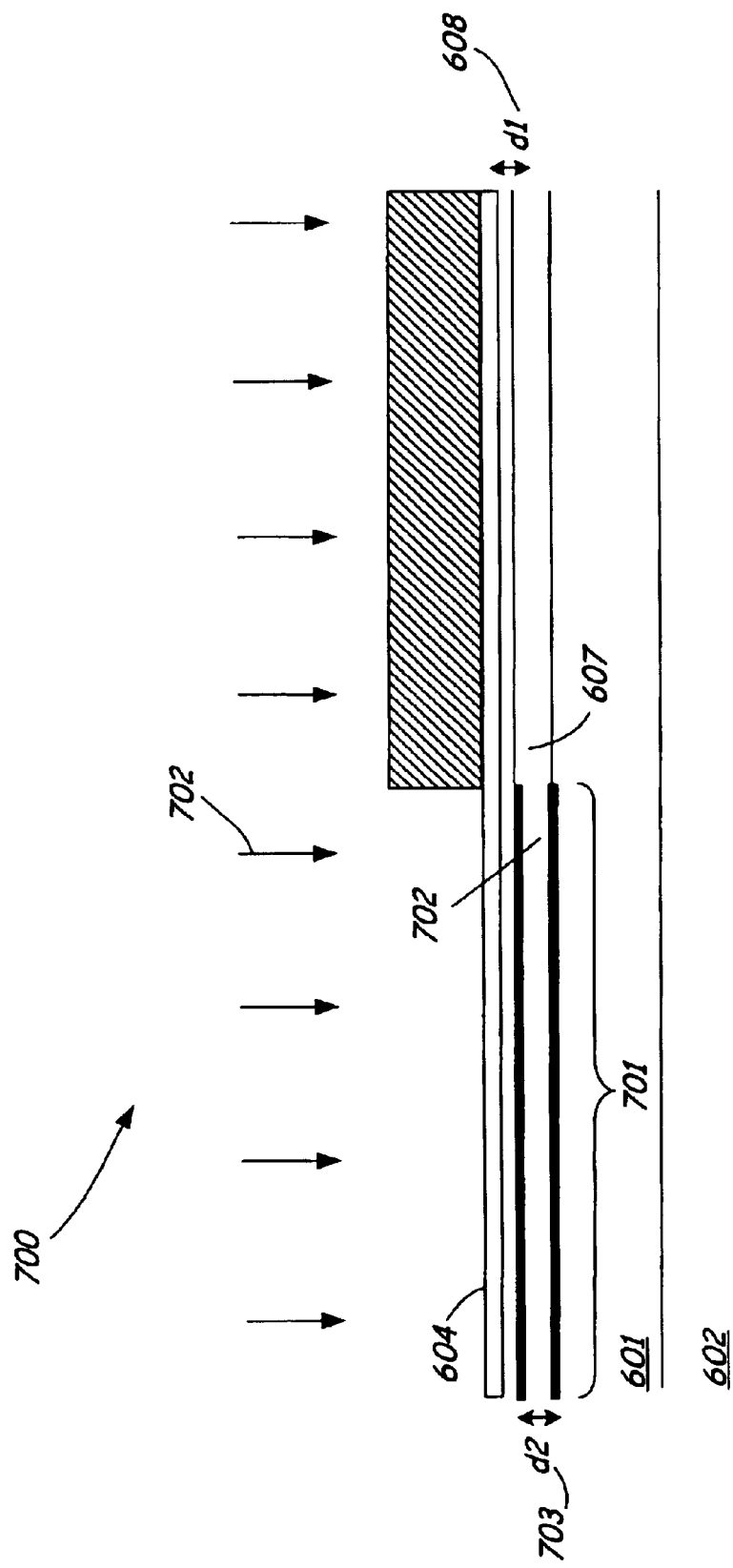
FIG. 7 illustrates an exemplary embodiment of the present invention process using implantation of the N-type device active region.

Referencing FIG. 7, the resist pattern layer 605 is stripped, and the wafer is patterned again so that an active region of the N-type device 701 is exposed. The dopant Indium 702 for the N-type device active region 701 is ion-implanted through the screen oxide 604 to a predetermined depth d2 703 in the silicon (e.g. approximately 1000 Å).

Figure 8:
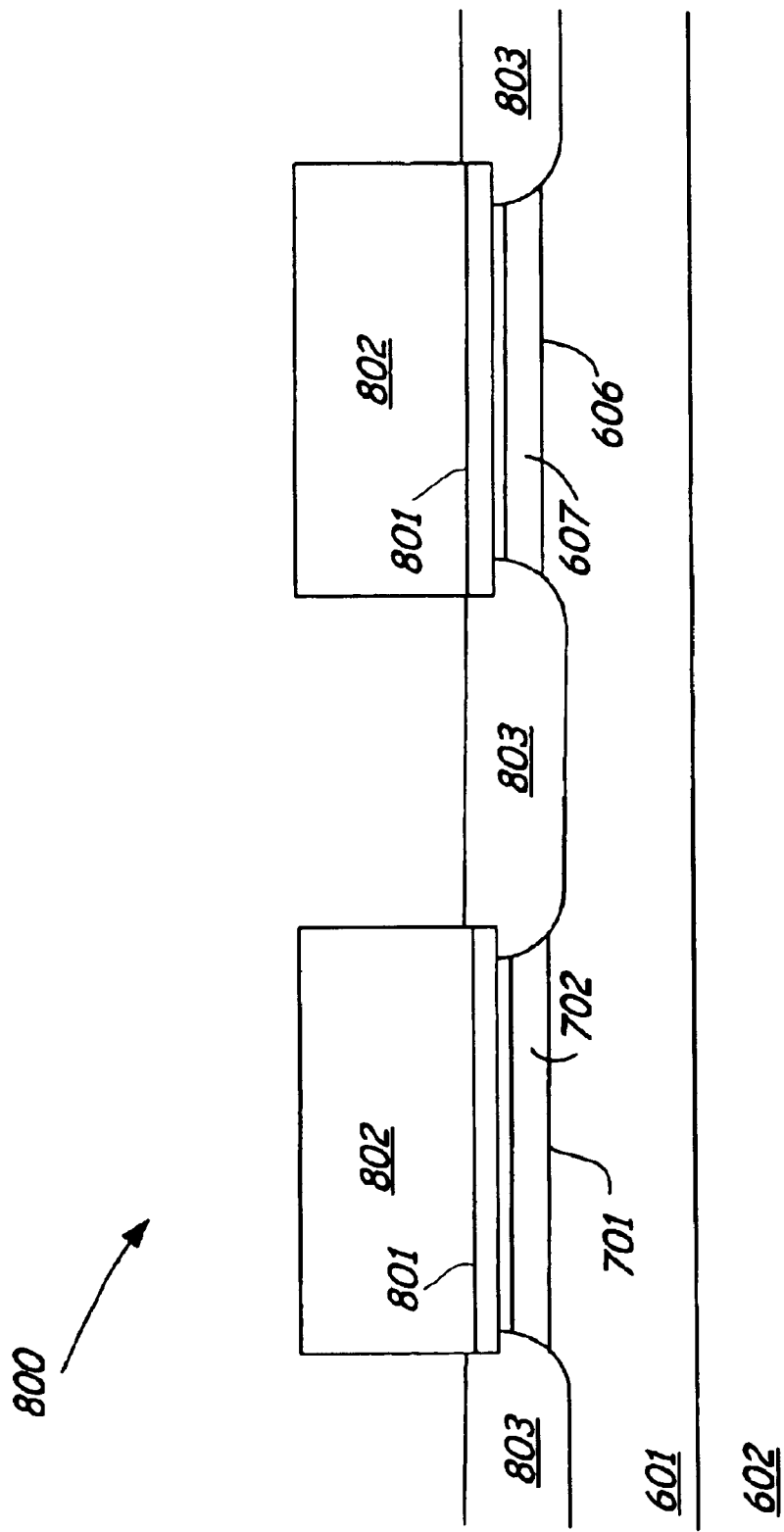
FIG. 8 illustrates an exemplary embodiment of the present invention process using a formation of a LOCOS field oxide for device isolation.

Referencing FIG. 8, P-type and N-type device active regions 606, 701 are isolated by an isolation process, such as local oxidation of silicon (LOCOS). For example, the screen oxide 604 is removed in hydro-fluoric acid, and a thin pad oxide 801 (e.g. approximately 150 Å) is grown. A layer of Si3N4 802 is then deposited on the wafer (approximately 3000 Å). Lithographic techniques define the field oxide regions and the wafer is oxidized. Typically, the field oxide regions 803 have a thickness of 2500 Å and are partially recessed into the epitaxial semiconductor substrate 601. The pad oxide 801 and nitride film 802 are then stripped. In another exemplary embodiment, the device active regions 606, 701 are isolated by a simple oxide process, as explained in U.S. provisional patent application No. 60/381,162, filed on May 16, 2002. For example, the screen oxide 604 is removed in hydrofluoric acid, and then an isolation oxide is grown having a thickness of approximately 100 Å. The active regions 606, 701 and field oxide regions 803 are then patterned by standard lithographic techniques. It is important to understand that this simple oxide process produces a field oxide 803 that is not recessed into the semiconductor substrate 601 to a depth substantially lower than the source-drain junction 1102, 1103, 1202, 1203 depth.

Figure 9:
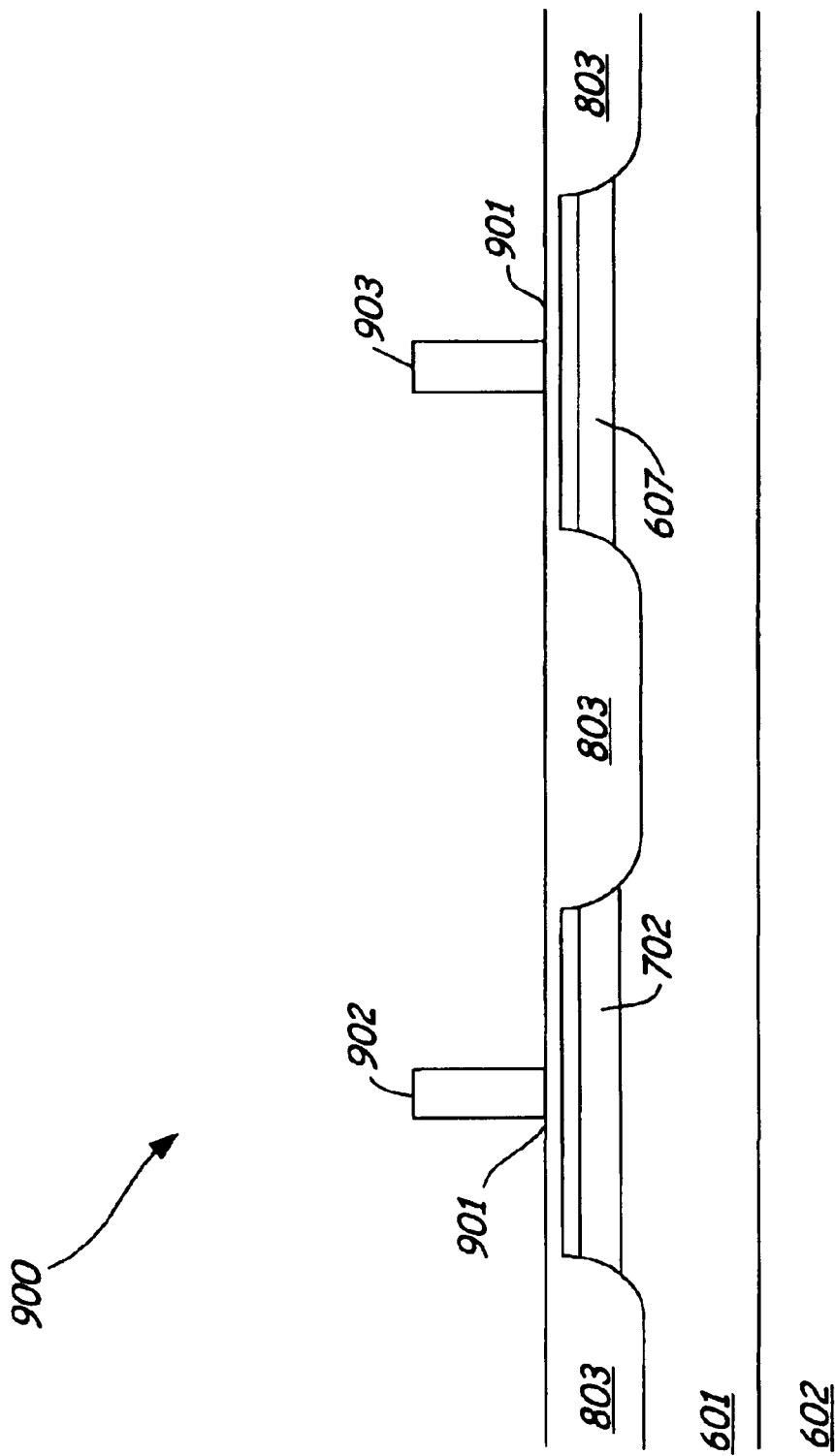
FIG. 9 illustrates an exemplary embodiment of the present invention process using a patterned silicon film on thin gate oxide.

Referencing FIG. 9, a thin gate oxide 901 (e.g. approximately 10–40 Å) is grown. In another embodiment, a material having a high dielectric constant ("high K") is used as the insulating layer 901. Examples of high K materials are those materials having dielectric constants greater than that of silicon dioxide, including for example metal oxides such as $TiO_2$. The use of a high K gate insulating layer in combination with a Schottky barrier device results in additional improvements in drive current, as explained in U.S. patent application, Ser. No. 10/215,447, filed Aug. 9, 2002.

In one embodiment, a polysilicon layer having thickness of approximately 2000 Å is deposited. Using lithographic techniques (a first mask), the PMOS active regions are masked, and the exposed polysilicon in the NMOS active regions is heavily doped with an N-type dopant, such as phosphorous by ion implantation. Then, again using lithographic techniques (a second mask), the NMOS active regions are masked, and the exposed polysilicon in the PMOS active regions is heavily doped with an P-type dopant, such as boron by ion implantation. The substrate is annealed so that the implanted dopants in the channel region and gate electrodes are electrically activated and redistributed. Using lithographic techniques (a third mask) and a silicon etch that is highly selective to oxide, the N-type 902 and P-type 903 gate electrodes are patterned as shown in the process step 900 illustrated in FIG. 9.

In another embodiment, the gate electrodes are formed using a two mask dual in-situ doped poly process, as explained in U.S. provisional application No. 60/381,240, filed May 16, 2002. In this exemplary embodiment, an in-situ doped N-type polysilicon layer having a thickness of approximately 500 Å is deposited. Using lithographic techniques (a first mask), the NMOS active regions are masked, and the exposed polysilicon in the PMOS active regions is partially etched. Then a second etch, highly selective to the underlying gate oxide 901 is used to remove the remaining N-type doped polysilicon in the PMOS active regions. Next, an in-situ doped P-type polysilicon layer having a thickness of approximately 1500 Å is deposited. Using lithographic techniques (a second mask) and a silicon etch that is highly selective to oxide, the N-type 902 and P-type 903 gate electrodes are patterned as shown in the process step 900 illustrated in FIG. 9. The resulting in-situ doped polysilicon gate 902 for the N-type device is thicker than the gate 903 of the P-type device. The substrate is optionally annealed to distribute the dopants uniformly throughout the N-type 902 and P-type 903 gate electrodes.

Figure 10:
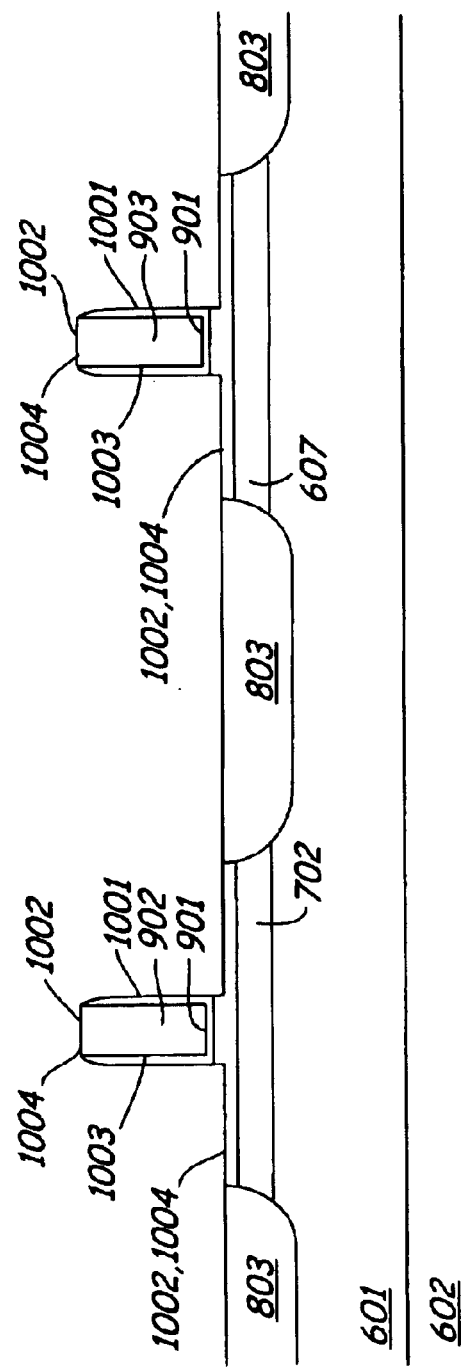
FIG. 10 illustrates an exemplary embodiment of the present invention process using a formation of thin oxide sidewalls, and exposure of silicon in the gate, source and drain areas.

Referencing FIG. 10, a thin oxide (approximately 100 Å) is then thermally grown on the horizontal surface 1002 and sidewalls 1003 of the silicon gate electrodes. An anisotropic etch is then used to remove the oxide layers on the horizontal surfaces 1002 (and thus expose the silicon 1004), while preserving the sidewall oxide 1001 on the vertical surfaces. In this way, a thin sidewall spacer oxide 1001 is formed, as shown in the process step 1000 illustrated in FIG. 10. In another exemplary embodiment, a thin sidewall spacer insulator 1001 may comprise an oxy-nitride layer or a nitride layer. An oxy-nitride layer is a material comprising both oxygen and nitrogen.

Figure 11:
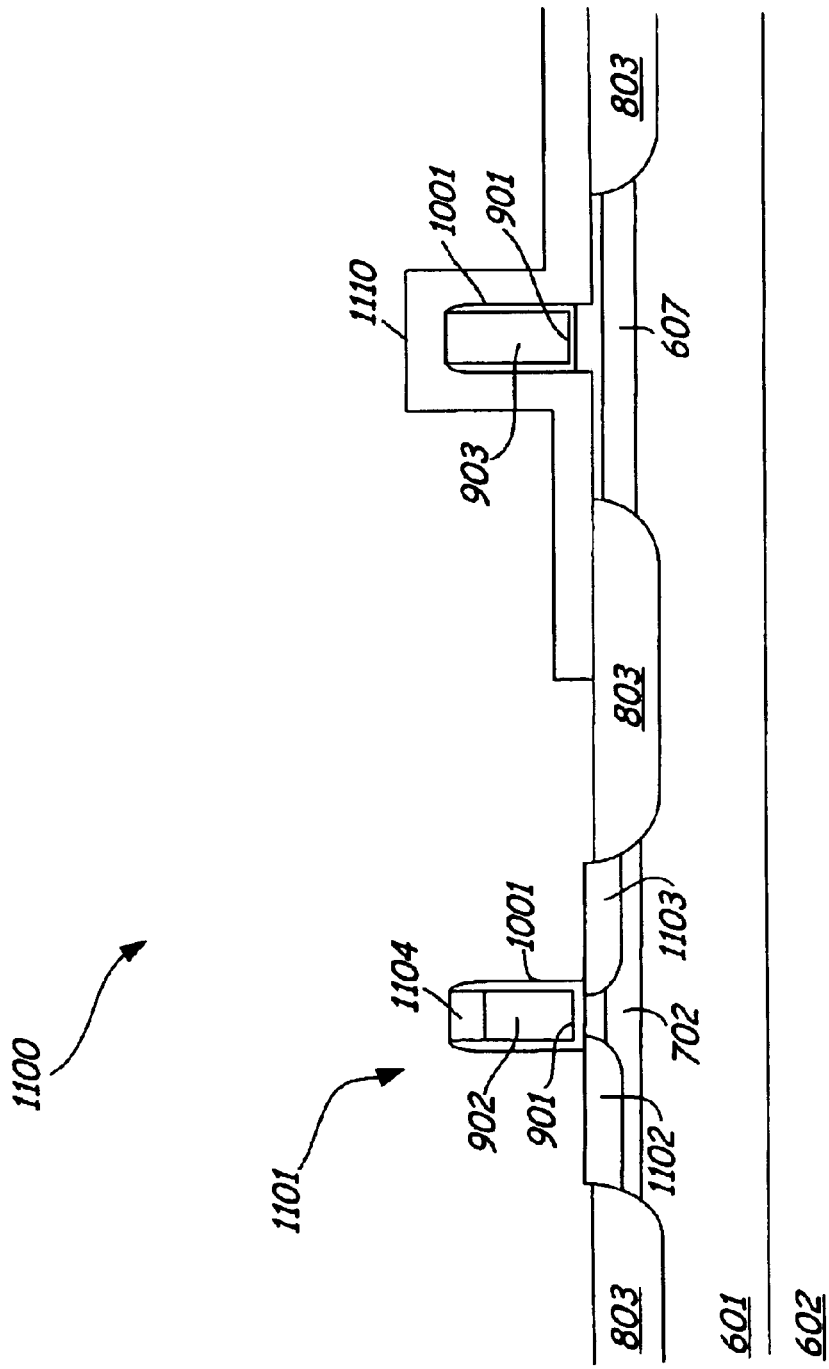
FIG. 11 illustrates an exemplary embodiment of the present invention process using a silicide exclusion mask and a metal deposition and silicidation anneal of the N-type device and using a removal of unreacted metal.

Referencing FIG. 11, the next step encompasses forming the metal silicide source and drain electrodes. In one embodiment, the wafer is patterned using an appropriate masking layer 1110 by lithographic techniques such that the P-type active regions of the N-type device 1101 are exposed. In one exemplary embodiment, the masking layer 1110 is a silicide exclusion mask oxide layer. A silicide exclusion mask oxide is deposited. Photoresist is deposited next, followed by patterning the photoresist, etching the silicide exclusion mask oxide layer 1110 by using for example a buffered oxide etch, and stripping the photoresist so that the N-type active regions are covered by the silicide exclusion mask oxide and thereby are protected from silicide formation. It is critical that a highly selective wet etch be used for the oxide mask etch so that the sidewall spacer oxide 1001 is not affected substantially. The wet etch, such as a buffered oxide etch, should preferentially etch deposited oxide with a rate substantially greater than the etch rate for the thermally grown sidewall oxide or other exemplary materials that may be used to provide a gate sidewall insulator spacer. The gate sidewall insulator of a conventional device is much thicker than that of a Schottky barrier MOS device. This makes the conventional MOS sidewall less susceptible to damage during wet chemical etches, making integration of silicide exclusion mask steps with a conventional CMOS process more straightforward.

An appropriate metal for a N-type device silicide (for example Erbium) is deposited, providing a metal layer across the wafer (approximately 200 Å). The wafer is then annealed for a specified time at a specified temperature (for example, 450° C. for 30 minutes) so that, at all places where the metal is in direct contact with the silicon, a chemical reaction takes place that converts the metal to a metal silicide at a source electrode 1102, a metal silicide at a drain electrode 1103, and a metal silicide at a gate electrode 1104. It is important that the exposed, partially etched, sidewall spacer 1001 provide complete protection of the gate electrode during the silicide-forming anneal. A wet chemical etch (e.g. HNO3 or H2SO4 for Erbium) is then used to remove the unreacted metal while leaving the metal-silicide untouched as shown in the process step 1100 as illustrated in FIG. 11.

In another embodiment, an appropriate metal for an N-type device silicide (for example Erbium) is deposited (approximately 150 Å) followed by deposition of a second appropriate metal (for example Titanium, approximately 50 Å), resulting in a layer having two metal layers. The wafer is then annealed for a specified time at a specified temperature (for example, 450° C. for 30 minutes) so that, at all places where the metal is in direct contact with the silicon, a chemical reaction takes place that converts both the first and second metal layers to metal silicides at a source electrode 1102, a metal silicides at a drain electrode 1103, and metal silicides at a gate electrode 1104. A wet chemical etch (Sulfuric Peroxide) is then used to remove the unreacted metal while leaving the metal-silicides untouched.

It is important to select a second metal (for example Titanium) in order to preserve the original deposited metal layer ordering. For example, in the previously described exemplary process, a bottom surface of the Erbium Silicide is in contact with the semiconductor substrate and a top surface of the Erbium Silicide is in contact with the Titanium Silicide. The second silicide provides improved manufacturability by providing a more robust etch stop for later metallization processing steps, reduces the net resistivity of the source and drain electrodes and is more stable in room temperature oxidizing ambients, as explained in U.S. provisional application Ser. No. 60/381,238, filed May 16, 2002.

Because the source and drain silicide fabrication steps require relatively low substrate temperatures (for example, less than 700° C.) compared to conventional impurity doped source/drain fabrication processes that require much higher temperatures (for example, greater than 1000° C.), other non-standard materials in silicon-based CMOS, such as high K dielectrics, metal gates or strained silicon, can be more easily integrated into the CMOS fabrication process of the present invention, as explained in U.S. provisional application No. 60/381,320, filed May 16, 2002.

Figure 12:
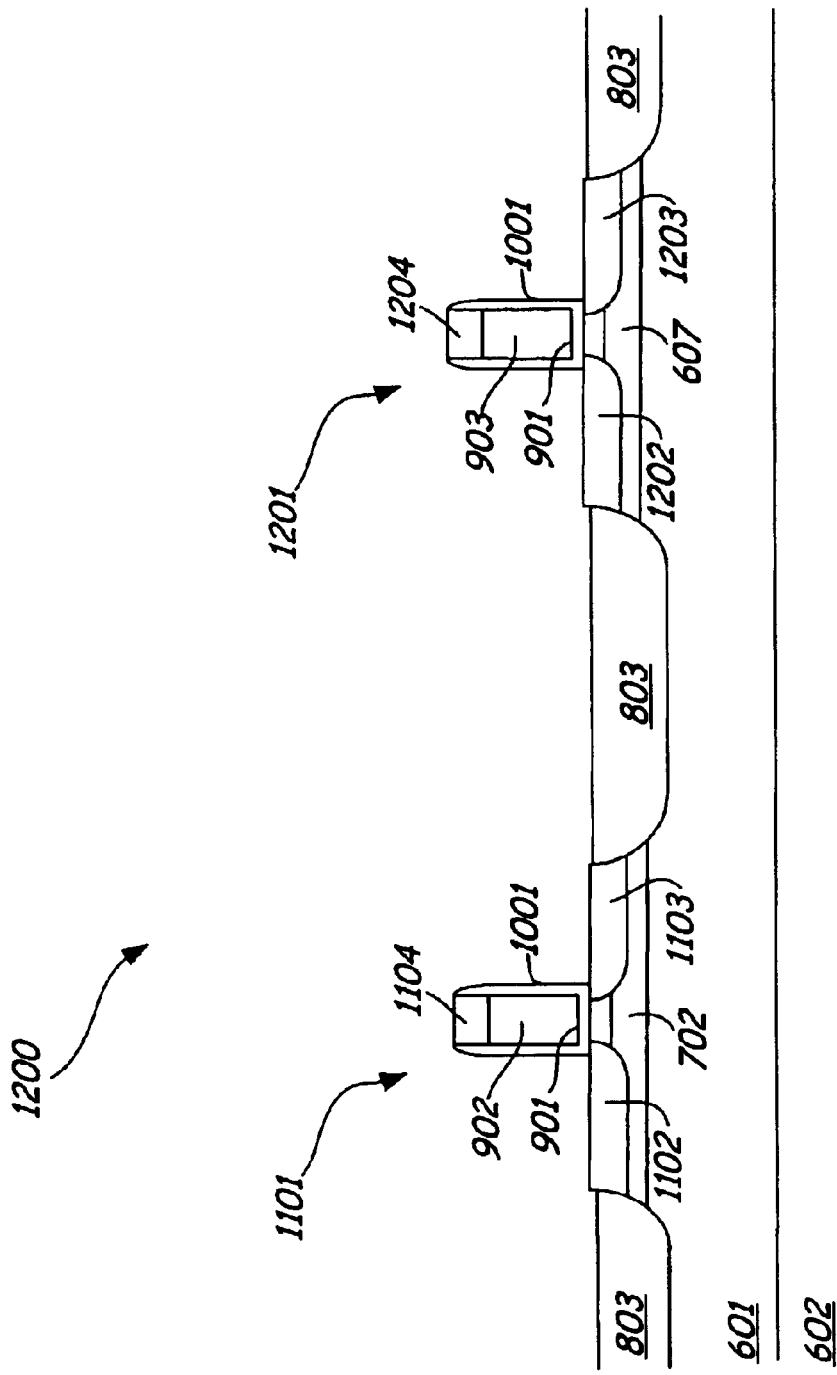
FIG. 12 illustrates an exemplary embodiment of the present invention process using a silicide exclusion mask and a metal deposition and silicidation anneal of the P-type device and using a removal of unreacted metal.

Referencing FIG. 12, the wafer is patterned again with an appropriate masking layer by lithographic techniques such that the N-type active regions of the P-type device 1201 are exposed. In one exemplary embodiment, the masking layer is a silicide exclusion mask oxide layer. A silicide exclusion mask oxide is deposited. Photoresist is deposited next, followed by patterning the photoresist, etching the silicide exclusion mask oxide layer by using, for example, a buffered oxide etch, and stripping the photoresist so that the P-type active regions and N-type devices 1101 are covered by the silicide exclusion mask oxide and thereby are protected from silicide formation. It is critical that a highly selective wet etch be used for the oxide mask etch so that the PMOS device 1201 sidewall spacer 1001 is not affected substantially. The wet etch, such as a buffered oxide etch, should preferentially etch deposited oxide with a rate substantially greater than the etch rate for the thermally grown sidewall oxide or other exemplary materials that may be used to provide a gate sidewall insulator spacer.

An appropriate metal for a P-type device silicide (for example Platinum) is deposited, providing a metal layer across the wafer (approximately 200 Å). The wafer is then annealed for a specified time at a specified temperature (for example, 400° C. for 45 minutes) so that, at all places where the metal is in direct contact with the silicon, a chemical reaction takes place that converts the metal to a metal silicide at a drain electrode 1202, a metal silicide at a source electrode 1203, and a metal suicide at a gate electrode 1204. It is important that the exposed, partially etched, sidewall spacer oxide 1001 provides complete protection of the gate electrode during the silicide-forming anneal. A wet chemical etch (aqua regia for Platinum) is then used to remove the unreacted metal while leaving the metal-silicide untouched as shown in the process step 1200 as illustrated in FIG. 12. The processes described with reference to process step 1100 (as shown in FIG. 11) and process step 1200 (as shown in FIG. 12) comprise an exemplary embodiment of a dual silicide exclusion mask process for Schottky barrier CMOS.

The dual silicides could be provided by another exemplary embodiment in which only one silicide exclusion mask is used. For example, An appropriate metal for an N-type device is deposited. Then a silicide exclusion masking layer is provided using lithographic techniques, thereby exposing the N-type active regions of the P-type device. A second metal appropriate for P-type device is deposited. The wafer is then annealed for a specific time at a specific temperature such that, at all places where the first metal is in direct contact with the silicon, a chemical reaction takes place that converts the metal to a metal silicide at a source electrode 1102, a metal silicide at a drain electrode 1103, and a metal silicide at a gate electrode 1104. Further, during the anneal, the second metal diffuses through the first metal, thereby forming a metal silicide at a source electrode 1202, a metal silicide at a drain electrode 1203, and a metal silicide at a gate electrode 1204.

Figure 13:
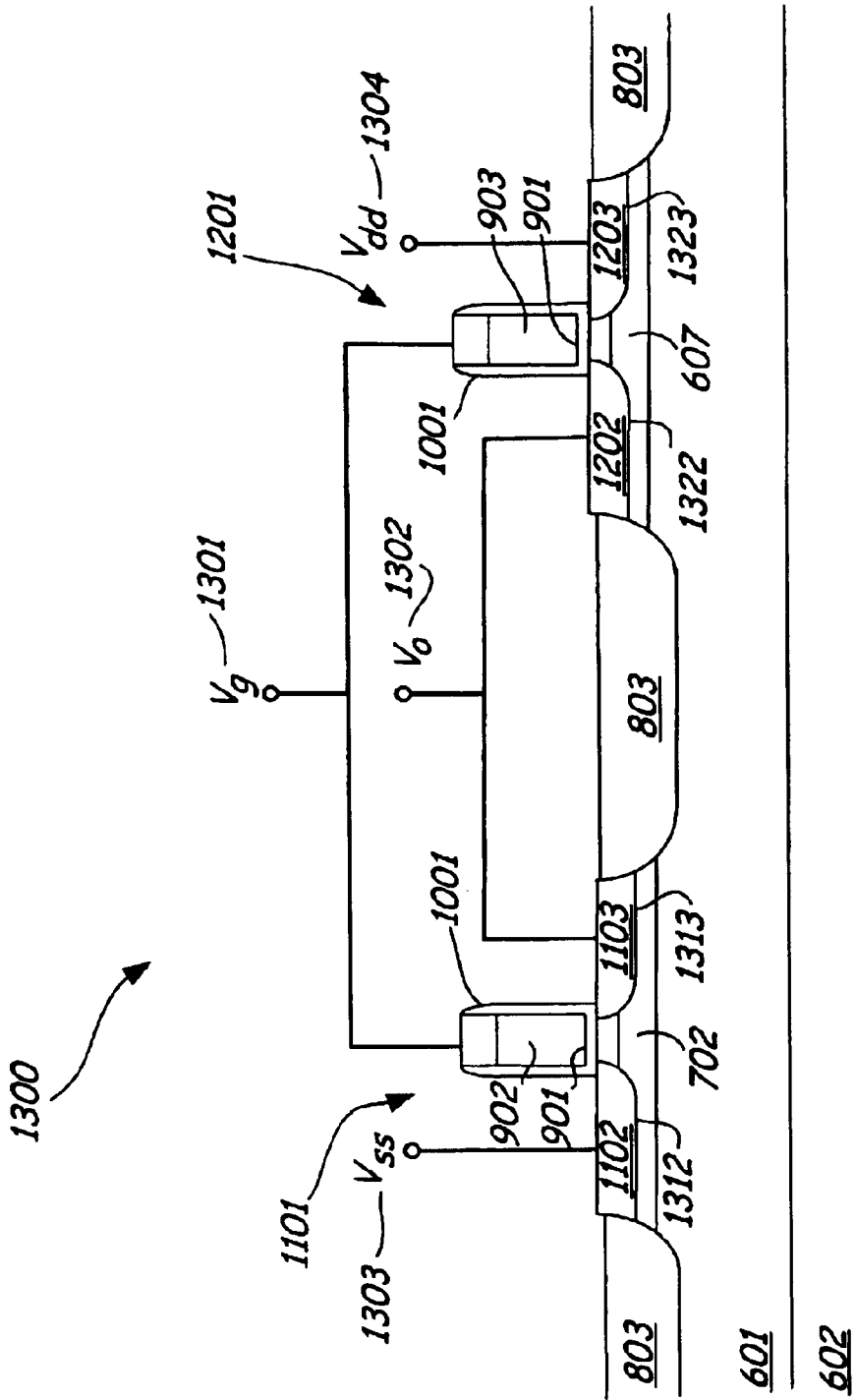
FIG. 13 illustrates an exemplary embodiment of the resulting structure of the present invention process.

The Schottky barrier NMOS 1101 and PMOS 1201 devices are now complete and ready for electrical contacting as shown in the process step 1300 illustrated in FIG. 13. To form a CMOS inverter circuit 1300 as shown in FIG. 13, electrical conductor lines are added to connect the gate electrodes 902 and 903 to form an input Vg 1301 for the CMOS circuit 1300 and to connect the drain electrodes 1103 and 1202 to form an output $V_o$ 1302 for the CMOS circuit 1300. Electrical conductor lines are also added to connect the NMOS source electrode 1102 to Vss 1303 and connect the PMOS source electrode 1202 to the supply voltage $V_{dd}$ 1304.

In summary, a total of 8 masking steps are required for this exemplary Schottky barrier CMOS fabrication process:

| Mask No. | Mask Function |
| --- | --- |
| 1 | PMOS Arsenic implant |
| 2 | NMOS Indium implant |
| 3 | Active |
| 4 | NMOS Phosphorous implant |
| 5 | PMOS Boron implant |
| 6 | Gate |
| 7 | Platinum silicide exclusion |
| 8 | Erbium silicide exclusion |

Using a two-mask dual in-situ doped poly process to form the gate electrodes cuts one of the eight mask steps. It would be appreciated to one skilled in the art that the above process is merely one way of achieving metal source/drain Schottky CMOS devices, and that many variants and alternatives exist.

Device/System

FIG. 13 shows a cross-sectional view of an exemplary embodiment of the invention, as exemplified by two final complementary MOSFET structures (1300). This embodiment comprises an NMOS device 1101 fabricated with Erbium Silicide for the source/drain regions 1102, 1103, and a PMOS device 1201 fabricated with Platinum Silicide for the source/drain regions 1202, 1203. The Schottky (or Schottky-like) barriers (1312, 1313, 1322, 1323) that exist along the interface of the corresponding metal source/drain 1102,1103,1202,1203 and the silicon substrate 601 act as an inherent pocket or halo implant and does so without added parasitic capacitance. It also eliminates the need for shallow implanted source/drain extensions as the metal source/drain is by its nature shallow and highly conductive. It further eliminates the need for well implants electrically contacted via ohmic contacts to $V_{dd}$ and ground power supplies for the PMOS and NMOS devices respectively. Significant reductions in manufacturing complexity are therefore achieved by simultaneous elimination of the halo/pocket implants, source/drain extension implants, and well implants electrically contacted via ohmic contacts. These are also major advantages over conventionally-architected MOS devices.

Metal silicide source/drain extensions may be used for the NMOS and PMOS source and drain regions (1102, 1103, 1202, 1203) to further enhance the performance of the Schottky barrier CMOS device, as explained in U.S. provisional patent application No. 60/381,321, filed May 16, 2002.

Due to the atomically abrupt nature of the Schottky barrier and the very consistent and repeatable magnitude of this barrier, two sources of statistical variation which are endemic to conventional MOS devices are virtually eliminated. The random statistical nature of dopant introduction via ion-implantation in conventional devices produces significant variations in the position and magnitude of implanted dopants. This is true for both the halo/pocket and source/drain dopants. The result is a certain amount of random variation in device parameters such as channel length (L), drive current, and leakage current. These variations make circuit design more difficult and contribute to manufacturing cost via yield loss due to ICs that do not meet performance specifications. The problem becomes more severe as channel lengths are reduced due to the smaller effective volume of silicon per device, and therefore less averaging to smooth away statistical variations.

Because the metal source/drain (which replaces the conventional impurity doped source/drain) has a natural, very consistent and atomically abrupt Scotty barrier (1312, 1313, 1322, 1323) with the silicon substrate 601 whose position and magnitude are independent of channel length, and because this barrier essentially plays the role of the halo/pocket implant (making these implants unnecessary), statistical variations due to random placement of atoms during the source/drain and halo/pocket implants are essentially eliminated. This fact remains true and even becomes more true as the channel length is reduced.

Another benefit of the metal source/drain MOS architecture is the unconditional elimination of the parasitic bipolar gain. The parasitic bipolar gain is a direct result of using opposite doping types for the source/drain and substrate regions, and can result in latch-up and other deleterious effects. When the source/drain electrodes are constructed of metal, thereby providing Schottky barrier contacts with the semiconductor substrate, this parasitic gain is eliminated. This makes the metal source/drain architecture ideal for (among other things) high-radiation environments. Additionally, having no parasitic bipolar gain eliminates the need for well implants electrically contacted via ohmic contacts to $V_{dd}$ and ground power supplies for PMOS and NMOS devices, respectively, resulting in reduced processing steps, lower costs and improved yields. Because Schottky barrier CMOS is not susceptible to parasitic bipolar action, it could also find application in the field of Power MOSFET devices, as previously disclosed in U.S. provisional application No. 60/381,237, filed May 16, 2002.

Indium 702 and Arsenic 607 layers are used as the channel and substrate dopants for the NMOS and PMOS devices, respectively. These dopant atoms are used due to their relatively low rates of diffusion through the silicon lattice (compared to Phosphorous and Boron, the other two possible candidates for channel and substrate dopants). This allows for greater thermal budget during fabrication of the device, and therefore less statistical variation in the characteristics of the finished product. It is important to understand that the regions having channel and substrate dopants 607, 702 are not electrically connected to ohmic contacts.

The gate electrodes 902, 903 are fabricated from Boron and Phosphorous doped polysilicon films for the P-type and N-type devices, respectively. In this instance, Boron and Phosphorous are used due to their large solid-solubilities (compared to Arsenic and Indium).

The gate electrodes may be less than 100 nm in width (corresponding to the channel length L), as it is in this regime that the advantages of the Schottky barrier architecture over the conventional architecture become apparent. These include simplified processing due to the absence of need for pocket implants, and the resulting reduction in yield loss, capacitance and statistical variations in finished products.

Devices are separated from each other by an insulating layer, such as a thermally grown oxide (called a Field Oxide) 803 that works in conjunction with channel and substrate dopants to electrically isolate the devices from each other. This field oxide 803 may be provided for by a conventional process, such as LOCOS, producing a partially recessed field oxide 803, or a simpler device isolation process, such as a simple thin, non-recessed or shallow oxide. In this case, the shallow field oxide, sometimes referred to as an oxide window, does not extend into the substrate to a depth substantially lower than the source-drain junction depth. Use of a shallow field oxide window results in additional reduced processing steps, lower costs and improved yields.

Figure 14:
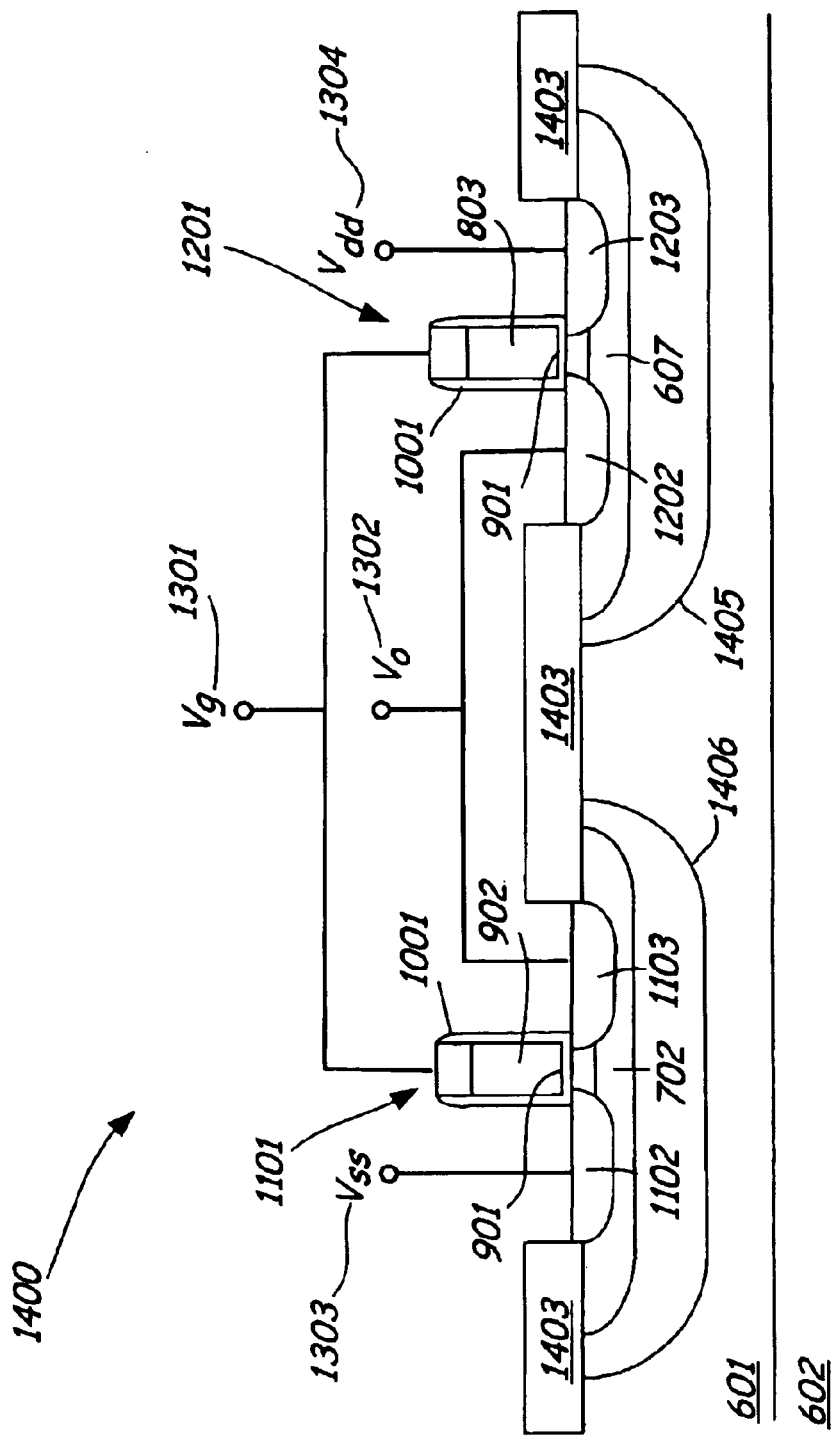
FIG. 14 illustrates an exemplary embodiment of a Schottky barrier CMOS inverter circuit having PMOS and NMOS devices connected in series with a simple thin field oxide and well implants not electrically contacted via ohmic contacts, in accordance with the principles of the present invention.

Referencing FIG. 14, the field oxide 1403 is a simple thin oxide that is not substantially recessed into the epitaxial semiconductor substrate 601. In this exemplary embodiment, optional well implants 1405, 1406 not electrically contacted to ohmic contacts may be used to isolate the PMOS and NMOS devices, respectively. It is significant to note that well implants electrically connected to ohmic contacts are not required for the PMOS or NMOS devices in the inverter circuit. If optional well implants are used, an additional Arsenic implant step would be provided for during process step 600 illustrated in FIG. 6 resulting in an Arsenic well 1405, and an additional Indium implant step would be provided for during process step 700 illustrated in FIG. 7 resulting in an Indium well 1406. The well implants 1405, 1406 are not required to be electrically contacted to ohmic contacts.

Figure 15:
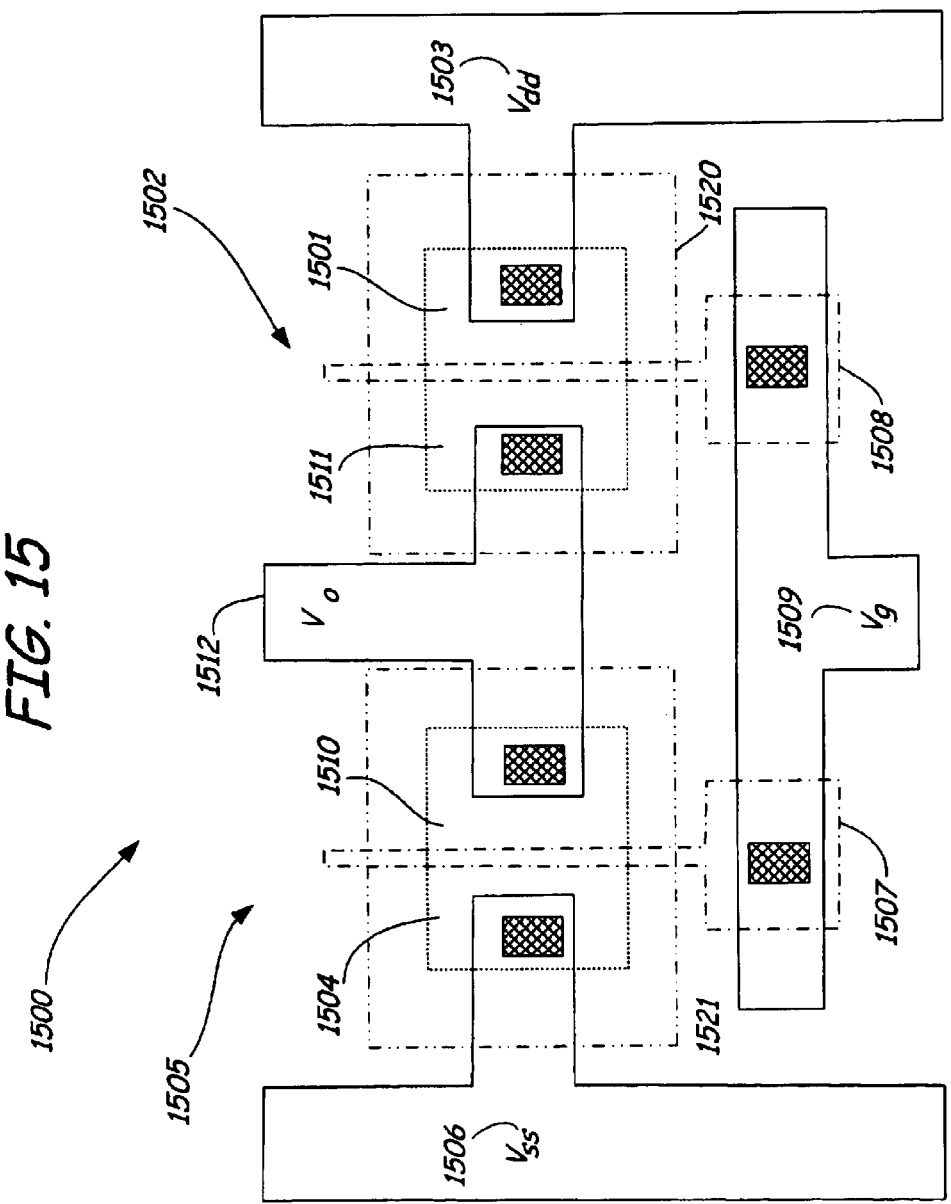
FIG. 15 illustrates an exemplary embodiment of a layout of the Schottky barrier CMOS inverter circuit having PMOS and NMOS devices connected in series, in accordance with the principles of the present invention.

FIG. 15 shows a top view of a preferred exemplary embodiment of the invention, as exemplified by a Schottky barrier CMOS inverting circuit and its typical operating and biasing conditions. The source 1501 of the PMOS device 1502 is connected to a positive supply voltage $V_{dd}$ 1503 while the source 1504 of the NMOS device 1505 is connected to $V_{ss}$ 1506, usually ground. The gate contacts 1507 and 1508 share a common input electrical connection $V_g$ 1509 and the drain contacts 1510 and 1511 share a common output electrical connection $V_o$ 1512. The PMOS device 1502 and NMOS device 1505 have optional well implants 1520, 1521 when using the simple thin oxide for device isolation. The well implants 1520, 1521 are not electrically connected to ohmic contacts. With this exemplary set of biasing conditions, the output voltage $V_o$ 1512 at the common drain connection of the two devices 1502 and 1505 depends on the input voltage $V_g$ 1509 at the gates. When $V_g$ 1509 is high (usually $V_{dd}$ 1503), then the N-type device 1505 is "on" and the P-type device 1502 is "off". That is, a channel region of the N-type device 1505 conducts while a channel region of the P-type device 1502 does not conduct. The result being that the output voltage $V_o$ 1512 changes to the low value $V_{ss}$ 1506. The opposite occurs when $V_g$ 1509 is low (usually $V_{ss}$ 1506). The N-type device 1505 is now "off" and the P-type device 1502 "on", and the output voltage $V_o$ 1512 changes to that of the P-type source, or $V_{dd}$ 1503, effectively providing an inverting function. The Schottky barrier CMOS circuit may be operated at reduced temperature to further enhance the power and speed performance, as explained in U.S. provisional application No. 60/388,659, filed May 16, 2002.

It would be appreciated to one skilled in the art that the above CMOS inverter circuit is merely one exemplary way of using complimentary Schottky barrier PMOS and NMOS transistors, and that many variations exist for combining PMOS and/or NMOS transistors in an integrated circuit, without departing from the spirit and scope of the present invention.

While the above description contains many specifics, these should not be construed as limitations on the scope of the invention, but rather as an exemplification of one preferred embodiment thereof. One skilled in the art will realize that many other variations are possible. For example, there are many possible candidates for the source/drain metal. It may also be advantageous to insert a thin oxide layer between the metal and the silicon substrate. The silicon substrate itself may be replaced by any number of other semiconductors or substrate types such as SOI. Additionally, boundaries between layers or elements can always be graded or interposed with other materials or interface agents to improve performance. The present invention is intended to cover a Schottky barrier CMOS device including any of the various permutations of features disclosed herein or disclosed in the materials that have been incorporated by reference, and a Schottky barrier CMOS fabrication process including any permutation of the fabrication techniques disclosed herein or disclosed in the materials that have been incorporated by reference.

Although the present invention has been described with reference to preferred embodiments, persons skilled in the art will recognize that changes may be made in form and detail without departing from the spirit and scope of the invention.

We claim:

1. A method for fabricating a CMOS device on a semiconductor substrate, comprising the steps of:

providing for at least one Schottky barrier NMOS active region;

providing for at least one Schottky barrier PMOS active region;

forming a first type of metal in at least some areas of at least one Schottky barrier NMOS active region while preventing formation of the first type of metal in other areas of the semiconductor substrate; and forming a second type of metal in at least some areas of at least one Schottky barrier PMOS active region while preventing formation of the second type of metal in other areas of the semiconductor substrate.

2. A method for fabricating a CMOS device on a semiconductor substrate using a dual exclusion mask process, comprising the steps of:

providing at least one Schottky barrier NMOS active region comprising at least one gate electrode and an area of exposed semiconductor substrate;

providing at least one Schottky barrier PMOS active region comprising at least one gate electrode and an area of exposed semiconductor substrate;

providing a first exclusion mask layer for preventing formation of a first type of metal in the area of exposed semiconductor substrate in the Schottky barrier PMOS active region while exposing and thereby allowing formation of the first type of metal in the area of the exposed semiconductor substrate of the Schottky barrier NMOS active region, providing a second exclusion mask layer for preventing formation of a second type of metal in the area of exposed semiconductor substrate in the Schottky barrier NMOS active region while exposing and thereby allowing formation of the second type of metal in the area of the exposed semiconductor substrate of the Schottky barrier PMOS active region.

3. The method of claim 2, wherein the gate electrodes in the Schottky barrier NMOS and PMOS active regions have an electrically insulating sidewall spacer, the method further comprising the steps of:

patterning the first exclusion mask layer for the Schottky barrier PMOS active region using an etch having a first exclusion mask layer etch rate greater than a sidewall spacer etch rate, thereby exposing the semiconductor substrate in the Schottky barrier NMOS active region, the Schottky barrier NMOS active region having at least some areas of the exposed semiconductor substrate proximal to the exposed gate electrodes;

providing a Schottky or Schottky-like contact in exposed semiconductor substrate regions of the Schottky barrier NMOS active region in part by providing a metal layer to react with the exposed semiconductor substrate, the sidewall spacer providing a continuous barrier to a chemical reaction between gate electrode sidewalls and the metal layer;

patterning the second exclusion mask layer for the Schottky barrier NMOS active regions using an etch having a second exclusion mask layer etch rate greater than a sidewall spacer etch rate, thereby exposing the semiconductor substrate in the Schottky barrier PMOS active region, the Schottky barrier PMOS active region having at least some areas of the exposed semiconductor substrate proximal to the exposed gate electrodes; and providing a Schottky or Schottky-like contact in the exposed semiconductor substrate regions of the Schottky barrier PMOS active region in part by providing a Schottky metal layer to react with the exposed semiconductor substrate, the sidewall spacer providing a continuous barrier to a chemical reaction between the gate electrode sidewalls and the metal layer.

4. A method for fabricating a CMOS device on a semiconductor substrate using a dual exclusion mask process, the method comprising the steps of:

providing at least one gate electrode in at least one Schottky barrier N-type active region of the semiconductor substrate, the gate electrode having an electrically insulating sidewall spacer;

providing at least one gate electrode in at least one Schottky barrier P-type active region of the semiconductor substrate, the gate electrodes having an electrically insulating sidewall spacer;

providing a first exclusion mask layer for the Schottky barrier P-type active region, the exclusion mask layer patterned using an etch having an exclusion mask layer etch rate greater than a sidewall spacer etch rate, thereby exposing at least some of the semiconductor substrate in the Schottky barrier N-type active region;

providing a Schottky or Schottky-like contact in exposed semiconductor substrate of the Schottky barrier N-type active region by providing a thin metal layer to react with the exposed semiconductor substrate, the exposed sidewall spacer providing a continuous barrier to a chemical reaction between the gate electrode and the thin metal layer;

providing a second exclusion mask layer for the Schottky barrier N-type active region, the exclusion mask layer patterned using an etch having an exclusion mask layer etch rate greater than a sidewall spacer etch rate, thereby exposing the semiconductor substrate in at least some of the Schottky barrier P-type active region; and providing a Schottky or Schottky-like contact in the exposed semiconductor substrate of the Schottky barrier P-type active region by providing a Schottky contact material to react with the exposed semiconductor substrate, the exposed sidewall spacer providing a continuous barrier to a chemical reaction between the gate electrode and the Schottky contact material.

5. The method of claim 4 wherein the source electrode and the drain electrode of the Schottky barrier P-type active region are formed from a member of the group consisting of: Platinum Silicide, Palladium Suicide and Iridium Silicide.

6. The method of claim 4 wherein the source electrode and the drain electrode of the Schottky barrier N-type active region are formed from a member of the group consisting of the rare-earth silicides.

7. The method of claim 4 wherein at least one of the source and drain electrodes of the Schottky barrier P-type active region forms a Schottky or Schottky-like contact with the semiconductor substrate at least in areas adjacent to a channel which is between the source and drain electrodes.

8. The method of claim 4 wherein at least one of the source or drain electrodes of the Schottky barrier N-type active region forms a Schottky or Schottky-like contact with the semiconductor substrate at least in areas adjacent to a channel which is between the source and drain electrodes.

9. The method of claim 4 wherein an entire interface between at least one of the source and drain electrodes of the Schottky barrier P-type active region and the semiconductor substrate forms a Schottky contact or Schottky-like region with the semiconductor substrate.

10. The method of claim 4 wherein an entire interface between at least one of the source and drain electrodes of the Schottky barrier N-type active region and the semiconductor substrate forms a Schottky contact or Schottky-like region with the semiconductor substrate.

11. The method of claim 4 wherein the gate electrode is provided after completion of all channel doping processes.

12. The method of claim 4 wherein channel dopants are introduced into the semiconductor substrate for the Schottky barrier P-type and Schottky barrier N-type active regions.

13. The method of claim 4 wherein channel dopants are introduced in the semiconductor substrate such that dopant concentration varies significantly in a vertical direction and is generally constant in a lateral direction for Schottky barrier P-type and Schottky barrier N-type active regions.

14. The method of claim 4 wherein channel dopants are selected from the group consisting of: Arsenic, Phosphorous, Antimony, Boron, Indium, and Gallium.

15. The method of claim 4 wherein the source and drain electrodes of the Schottky barrier P-type and N-type active regions are provided such that a channel length is less than or equal to 100 nm.

16. The method of claim 4 wherein the gate electrode is provided by the steps comprising:

providing a gate insulator comprising an electrically insulating layer on the semiconductor substrate;

depositing a conducting film on the insulating layer;

patterning and etching the conducting film to form the gate electrode; and forming the electrically insulating sidewall spacer by providing at least one thin insulating layer on at least one sidewall of the gate electrode.

17. The method of claim 16 wherein the gate insulator has a dielectric constant greater than 4.0.

18. The method of claim 16, wherein the gate insulator is formed from a member of the group consisting of metal oxides.

19. The method of claim 4, wherein the semiconductor substrate is strained.

20. The method of claim 4, wherein the Schottky or Schottky-like contact in the exposed semiconductor substrate of the Schottky barrier N-type active region is provided by providing a first thin metal layer in contact with the exposed semiconductor substrate, and a second thin metal layer in contact with the first thin metal layer, wherein the first and second thin metal layers react with the exposed semiconductor substrate by a thermal anneal.

21. The method of claim 20, wherein the second thin metal layer is formed from titanium.

* * * * *

UNITED STATES PATENT AND TRADEMARK OFFICE
CERTIFICATE OF CORRECTION

PATENT NO. : 6,974,737 B2
APPLICATION NO. : 10/440498
DATED : December 13, 2005
INVENTOR(S) : John P. Snyder and John M. Larson It is certified that error appears in the above-identified patent and that said Letters Patent is hereby corrected as shown below:

| Col. | Line | Reads | Should Read |
|---|---|---|---|
| 8 | 36 | " depth $d_1$, 407." | -- depth $d_1$ 407. -- |
| 13 | 64 | "450° C. for" | -- 450° C for -- |
| 14 | 15 | " 450° C. for" | -- 450° C for -- |
| 14 | 39 | " 700 ° C." | -- 700° C -- |
| 14 | 41 | "1000 ° C." | -- 1000° C -- |
| 15 | 3 | "400° C. for" | -- 400° C for -- |

Signed and Sealed this

Fifth Day of December, 2006

JON W. DUDAS
*Director of the United States Patent and Trademark Office*